(12) United States Patent
Allen et al.

(10) Patent No.: US 10,174,229 B2
(45) Date of Patent: Jan. 8, 2019

(54) ADHESIVE RESINS FOR WAFER BONDING

(71) Applicant: International Business Machines Corporation, Armonk, NY (US)

(72) Inventors: Robert D. Allen, San Jose, CA (US); Jeffrey Gelorme, Burlington, CT (US); Li-Wen Hung, Mahopac, NY (US); Ratnam Sooriyakumaran, San Jose, CA (US); Linda K. Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/817,843

(22) Filed: Nov. 20, 2017

(65) Prior Publication Data

US 2018/0072926 A1    Mar. 15, 2018

Related U.S. Application Data

(62) Division of application No. 14/865,251, filed on Sep. 25, 2015, now Pat. No. 9,850,406.

(60) Provisional application No. 62/077,103, filed on Nov. 7, 2014.

(51) Int. Cl.
| | |
|---|---|
| *C09J 129/10* | (2006.01) |
| *H01L 21/50* | (2006.01) |
| *C09J 125/08* | (2006.01) |
| *H01L 21/683* | (2006.01) |
| *C08F 212/08* | (2006.01) |
| *C09J 133/06* | (2006.01) |

(52) U.S. Cl.
CPC ........... *C09J 129/10* (2013.01); *C08F 212/08* (2013.01); *C09J 125/08* (2013.01); *C09J 133/06* (2013.01); *H01L 21/50* (2013.01); *H01L 21/6835* (2013.01); *H01L 2221/6834* (2013.01); *H01L 2221/68318* (2013.01); *H01L 2221/68327* (2013.01); *H01L 2221/68381* (2013.01); *Y02P 20/582* (2015.11)

(58) Field of Classification Search
CPC ....................................................... C09J 129/10
See application file for complete search history.

(56) References Cited

U.S. PATENT DOCUMENTS

2013/0330546 A1* 12/2013 Takami ............... H01L 21/6836
                                                                        428/354
2014/0106473 A1    4/2014 Andry et al.

FOREIGN PATENT DOCUMENTS

| EP | 1071121 A1 | 1/2001 |
|---|---|---|
| JP | 2012042601 A | 3/2012 |
| JP | 2014043591 A | 3/2014 |

(Continued)

OTHER PUBLICATIONS

List of IBM Patents or Patent Applications Treated as Related dated Nov. 20, 2017, 2 pages.

*Primary Examiner* — Daniel H Lee
(74) *Attorney, Agent, or Firm* — Tutunjian & Bitetto, P.C.; Erik Johnson

(57) ABSTRACT

An adhesive bonding method that includes bonding a handling wafer to a front side surface of a device wafer with an adhesive comprising N-substituted maleimide copolymers. The device wafer may then be thinned from the backside surface of the device wafer while the device wafer is adhesively engaged to the handling wafer. The adhesive can then be removed by laser debonding, wherein the device wafer is separated from the handling wafer.

16 Claims, 7 Drawing Sheets

(56) References Cited

FOREIGN PATENT DOCUMENTS

| JP | 2014070191 A | 4/2014 |
|---|---|---|
| WO | 2014073191 A1 | 5/2014 |

* cited by examiner

ADHESIVE RESINS FOR WAFER BONDING

BACKGROUND

Technical Field

The present disclosure relates generally to adhesives employed in wafer bonding.

Description of the Related Art

Temporary wafer bonding/debonding is an important technology for implementing the fabrication of semiconductor devices, photovoltaic devices, and electrical devices of micron and nanoscale. Bonding is the act of attaching a device wafer, which is to become a layer in a final electronic device structure, to a substrate or handling wafer so that it can be processed, for example, with wiring, pads, and joining metallurgy. Debonding is the act of removing the processed device wafer from the substrate or handling wafer so that the processed device wafer may be employed into an electronic device. Some existing approaches for temporary wafer bonding/debonding involve the use of an adhesive layer placed directly between the silicon device wafer and the handling wafer. When the processing of the silicon device wafer is complete, the silicon device wafer may be released from the handling wafer by various techniques, such as by exposing the wafer pair to chemical solvents delivered by perforations in the handler, by mechanical peeling from an edge initiation point or by heating the adhesive so that it may loosen to the point where the silicon device wafer may be removed by sheering.

SUMMARY

In one embodiment, a method for adhesive bonding in microelectronic device processing is provided that includes bonding a handling wafer to a front side surface of a device wafer with an adhesive comprising N-alkyl or N-aryl maleimide copolymers, wherein the co-monomers include styrenic monomers, norbornene derivatives, vinyl ethers and maleic anhydride; and thinning the device wafer from the backside surface of the device wafer while the device wafer is adhesively engaged to the handling wafer. After the device wafer has been thinned, the adhesive may be removed by laser debonding, wherein the device wafer is separated from the handling wafer. In this instance, the co-polymer can be defined as polymers having at least two different monomer units. In some examples, the polymer may comprise more than two different monomer units. In one example, the maleimide copolymer is provided by styrene-N-substituted maleimide copolymer. In another example, the copolymer is a vinyl ether-N-substituted maleimide copolymer. In yet another example, the copolymer is provided by norbornene-N-substituted maleimide copolymer. These polymers may have additional monomer units such as maleic anhydride.

In one embodiment, the adhesive bonding method may include bonding a handling wafer to a front side surface of a device wafer with an adhesive comprising N-substituted maleimide copolymers. The device wafer may then be thinned from the backside surface, while the device wafer is adhesively engaged to the handling wafer. The adhesive can then be removed by laser debonding, in which the device wafer is separated from the handling wafer. In some examples, the N-substituted maleimide copolymers is a vinyl ether/maleimide copolymer. In some examples, the N-substituted maleimide copolymer comprises poly(dodecyl vinyl ether-co-phenylmaleimide).

In another aspect of the present disclosure, a wafer bonding adhesive is provided. In one embodiment, the wafer bonding adhesive may be composed of styrene-maleimide copolymers dissolved in solvents commonly used in electronic industry and wherein the polymer is thermally stable at temperatures greater than 300° C., and has a glass transition temperature that is tunable within a range of 50° C. to 225° C.

In yet another embodiment of the present disclosure, a method of forming a wafer bonding adhesive is provided that includes providing a solvent commonly used in electronic industry, and dissolving styrene maleimide copolymers in the solvent, wherein molecular weight of the styrene-maleimide copolymers is selected to tune a glass transition temperature of the adhesive.

In yet another embodiment of the present disclosure, a method of forming a wafer bonding adhesive is provided that includes providing a solvent commonly used in electronic industry, and dissolving styrene maleimide copolymers in the solvent, wherein the functional groups in the styrene-maleimide copolymers are selected to tune the glass transition temperature of the adhesive.

In yet another embodiment of the present disclosure, a method of forming a wafer bonding adhesive is provided that includes providing a solvent commonly used in electronic industry, and dissolving vinyl ether-maleimide copolymers in the solvent, wherein molecular weight of the styrene maleimide copolymers is selected to tune a glass transition temperature of the adhesive.

In yet another embodiment of the present disclosure, a method of forming a wafer bonding adhesive is provided that includes providing a solvent commonly used in electronic industry, and dissolving vinyl ether-maleimide copolymers in the solvent, wherein the functional groups in the vinyl ether-maleimide copolymers are selected to tune the glass transition temperature of the adhesive.

A casting solvent can be used to prepare adhesive composition. The choice of solvent is governed by many factors not limited to the solubility and miscibility of resist components, the coating process, and safety and environmental regulations. It is also desirable that the solvent possess the appropriate volatility to allow uniform coating of films yet also allow significant reduction or complete removal of residual solvent during the post-application bake process. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl esters such as methyl cellosolve, butyl acetate, 2-ethoxyethanol, and ethyl 3-ethoxypropionate. Preferred solvents include ethyl lactate, propylene glycol methyl ether acetate, and mixtures of ethyl lactate and ethyl 3-ethoxypropionate. The above list of solvents is for illustrative purposes only and should not be viewed as being comprehensive nor should the choice of solvent be viewed as limiting the invention in any way.

In another aspect of the present disclosure, the composition of a wafer bonding adhesive is provided in which the adhesive composition comprises a maleimide copolymer dissolved in solvents that is thermally stable at temperatures greater than 300° C., and a glass transition temperature that is tunable within a range of 50° C. to 225° C. In some embodiments, the maleimide copolymer is an N-substituted maleimide copolymer. In some examples, the N-substituted maleimide copolymer is a vinyl ether/maleimide copolymer. In at least one example, the N-substituted maleimide copolymer may be poly(dodecyl vinyl ether-co-phenylmaleimide). The maleimide copolymer composition may also be is selected from the group consisting of styrene-N-alkylmaleimide copolymer, Styrene-N-arylmaleimide copolymer, vinyl ether-N-alkylmaleimide copolymer, vinyl ether-N-arylmaleimide copolymer, and combinations thereof.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
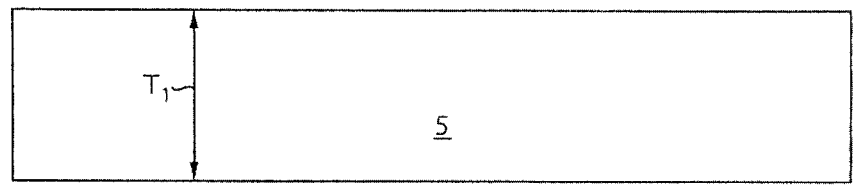
FIG. 1 is a side cross-sectional view of a semiconductor substrate that may be employed as a device wafer in a method of forming a semiconductor device that employs adhesive bonding of the device wafer to a handling wafer as part of a wafer thinning sequence, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods, compositions and structures disclosed herein provide low cost, thermoplastic materials that can be used as adhesives in temporary bonding of thin layers of semiconductor material, such as silicon containing material layers, to wafer handler substrates. As used herein, the term "thin" denotes a thickness of 5 microns to 10 microns. In some embodiments, the methods, compositions and structures disclosed herein provide an adhesive that can be used in method that employ laser debonding. Laser debonding is one method that is typically employed in layer transfer techniques used in microelectronic production, such as the formation of microelectronics employing silicon-containing substrates.

Typically, in laser debonding, a polyimide material is used as the adhesive connecting the device wafer to a handling wafer, wherein ablating the polyimide adhesive employs a deep UV excimer laser that debonds the device wafer from the handling wafer. The handling wafer may be a coefficient of thermal expansion (CTE) matched glass plate. In some examples, the polyimide that is used as the adhesive is known in the industry by tradename HD3007, which may be available from HD Microsystems, Inc. It has been determined that one disadvantage of using a polyimide adhesive material as the adhesive in wafer bonding methods in microelectronics device manufacturing is the relatively high processing temperature that is required to convert the polyimide precursor, i.e., polyamic acid, to a fully imidized polyimide before completing bonding of the handling wafer to the device wafer. The temperature range that is typically used to cure the polyimide to provide imidization ranges 300° C. to 400° C. In addition, the nature of a polyimide polymer is usually relatively stiff and rigid such that the polymer requires a high temperature to soften and bond to the handling wafer. The high temperatures required for both steps can do damage to sensitive devices that are included in the device wafer. Further, the high temperatures required for curing the polyimide for imidization and to soften the polyimide for softening can cause stresses in the device wafer that induce warping in the device wafer after cooling. Additionally, in order to remove polyimide residues that remain after debonding long soak times in strong hot solvents, such as N-methylpyrrolidone (NMP) and dimethyl sulfoxide (DMSO), may be required.

In some embodiments, the methods, structures and compositions provided herein provide a set of adhesives that are low cost and have been determined to have good bond/debonding performance for adhesives at lower temperatures than prior commercially available adhesive used in wafer bonding without exhibiting squeeze-out phenomena.

In one embodiment, the present disclosure provides an adhesive composed of maleimide copolymers for wafer bonding. The adhesive composition is suitable for wafer bonding and laser debonding. The term "maleimide" as used to describe the maleimide component of the copolymers of the present disclosure is the chemical compound which has the following chemical formula:

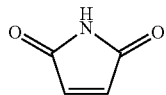

Maleimides also describes a class of derivatives of the parent maleimide where the H in the NH group is replaced with alkyl or aryl groups such as a methyl or phenyl, respectively. The substituent can also be a polymer such as polyethylene glycol.

The maleimide monomer unit that may be employed in the copolymer and terpolymer compositions of the present disclosure include Monomers of the structural unit of the maleimide compound represented by the formula (I) may preferably include, for example, N-methyl maleimide, N-ethyl maleimide, N-n-propyl maleimide, N-i-propyl maleimide, N-t-butyl maleimide, N-Hexyl, N-dodecyl maleimide, N-octadecyl maleimide, N-phenyl maleimide, N-o-methylphenyl maleimide, N-p-isopropyl phenyl maleimide, N-phenyl-α-methyl maleimide, N-phenyl-α-chloromaleimide, N-cyclohexyl maleimide and N-benzyl maleimide.

In some embodiments, in which the maleimide copolymer is employed as an adhesive for wafer bonding/laser debonding applications, the maleimide copolymer may have the composition of a styrene maleimide copolymer. For example, the styrene-maleimide copolymer composition may have the following chemical formula:

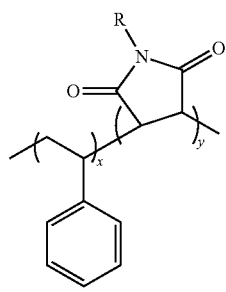

Wherein R is an alkyl or aryl group and x,y are number of repeat units.

Terpolymers (and tetra-polymers) comprising these two units are also included in the group described as styrene maleimide copolymers that can be used as adhesives in wafer bonding applications, in accordance with the present disclosure.

In some embodiments, terpolymer suitable for adhesive applications has the following structure:

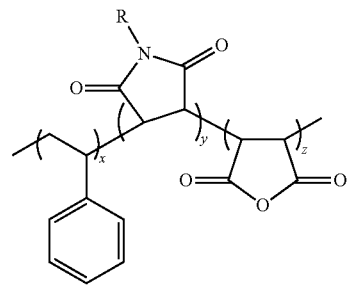

Wherein, R is alkyl or aryl group and x,y,z are number of repeat units.

The styrene-maleimide copolymers are typically thermally stable to temperatures of 300° C. and above. In one embodiment, the styrene maleimide copolymers adhesives may have a glass transition temperature (Tg) that is tunable in a temperature range that can range from 50° C. to 220° C. In another embodiment, the styrene-maleimide copolymer adhesives may have a glass transition temperature (Tg) that is tunable in a temperature range that ranges from 90° C. to 205° C.

The glass transition temperature (Tg) may be tuned by employing different compositions for the R-group in the above chemical formula for the styrene maleimide copolymer. For example, to adjust the glass transition temperature of the styrene maleimide copolymer, the R-group of the chemical formula may incorporate different aryl (e.g., phenyl) or alkyl groups. The term "aryl", as used to describe an aryl group, refers to any functional group or substituent derived from an aromatic ring, be it phenyl ($C_6H_5$), naphthyl ($C_{10}H_8$), thienyl ($C_4H_4S$), indolyl, etc. (see IUPAC nomenclature). Each of the aforementioned aryl groups may be employed as the R-group to tune the glass transition temperature (Tg) of the styrene maleimide copolymer. The term "alkyl", as used herein describes an alkyl substituent in which an alkane is missing one hydrogen. An acyclic alkyl has the general formula $C_nH_{2n+1}$. A cycloalkyl is derived from a cycloalkane by removal of a hydrogen atom from a ring and has the general formula $C_nH_{2n-1}$. Typically an alkyl is a part of a larger molecule. In structural formula, the symbol R is used to designate a generic (unspecified) alkyl group. The smallest alkyl group is methyl, with the formula $CH_3$—. Alkyls form homologous series. The simplest series have the general formula $C_nH_{2n+1}$. Alkyls include methyl ($CH_3$), ethyl ($C_2H_5$), propyl ($C_3H_7$), butyl ($C_4H_9$), pentyl ($C_5H_{11}$), hexyl ($C_6H_{13}$) and combinations thereof. Alkyl groups that contain one ring have the formula $C_nH_{2n-1}$, e.g. cyclopropyl and cyclohexyl. Each of the aforementioned alkyl groups may be employed as the R-group to tune the glass transition temperature (Tg) of the styrene maleimide copolymer.

In some embodiments, styrene-maleimide copolymer adhesive compositions can be provided that have a glass transition temperature (Tg) that ranges from 90° C. to 210° C. In some embodiments, the glass transition temperature (Tg) of the styrene maleimide copolymer adhesive may be 95, 100, 105, 110, 115, 120, 125, 130, 135, 140, 145, 150, 155, 160, 165, 170, 175, 180, 185, 190, 195, 200, and 205° C., as well as any range of temperatures including at least two of the above noted values. Adjustment of the glass transition temperature of the styrene maleimide adhesives to the above temperature ranges allows for the adhesive to be applied to a device wafer and then engaged, i.e., bonded, to a handling wafer at a temperature that does not mechanically damage the adhesive layer, the device wafer, and the carrier wafer.

The styrene maleimide copolymers can be made through simple free radical co-polymerization of styrene and maleic anhydride monomers followed by further chemical reaction with amine containing molecules on the polymer to form imides. Through this two stage polymer synthesis and modification, the styrene-maleimide copolymer adhesives can be tailored to possess the desired optical, thermal and rheological properties. Further, in some embodiments, the materials can be synthesized through direct polymerization of styrene and N-alkyl or N-aryl maleimide monomers if post-polymerization modification is desirable to avoid.

The styrene-maleimide copolymer adhesives are fully soluble and castable in common/safe solvents (e.g., PGMEA). The ability of styrene maleimide copolymer adhesives to be dissolved in a solvent, such as propylene glycol monomethyl ether acetate (e.g., PGMEA), provides that in wafer bonding techniques that employ laser bonding to detach the temporarily attached wafers that the adhesive may easily be removed from the wafers following debonding by dissolving it in the same solvents.

In some embodiments, in which the maleimide copolymer that are employed as adhesives for wafer bonding/laser debonding applications in accordance with the present disclosure has the composition of a vinyl ether-maleimide copolymer, the vinyl ether-maleimide copolymer composition may have the following chemical formula:

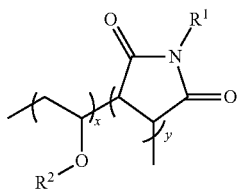

wherein x, y are number of monomer units, $R^1$, $R^2$ groups are selected from alkyl or aryl functionalities.

Terpolymers comprising these two units are also included in the group of vinyl ether-maleimide copolymers that are disclosed herein for use as adhesives in wafer bonding applications. The third monomer may be selected from maleic anhydride and other functionalized maleimides. In some embodiments the terpolymer suitable for adhesive applications has the following structure:

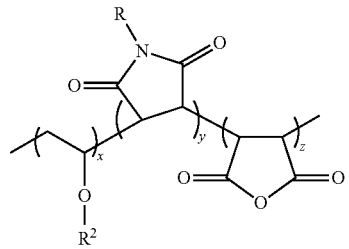

Wherein, $R^1$, and $R^2$ are independently selected form alkyl and aryl groups and x, y, z are number of repeat units.

The vinyl ether-maleimide copolymers are typically thermally stable to temperatures of 300° C. and above. In one embodiment, the vinyl ether maleimide copolymers and terpolymers may have a glass transition temperature (Tg) that is tunable in a temperature range that can range from 50° C. to 220° C. In another embodiment, the vinyl ether-maleimide copolymer and terpolymer adhesives may have a glass transition temperature (Tg) that is tunable in a temperature range that ranges from 90° C. to 205° C.

The glass transition temperature (Tg) may be tuned by employing different compositions for the $R^1$, $R^2$-groups in the above chemical formula for the vinyl ether maleimide copolymer and terpolymers. For example, to adjust the glass transition temperature of the styrene maleimide copolymer, the $R^1$, $R^2$-groups of the chemical formula may incorporate different aryl (e.g., phenyl) or alkyl groups. The term "aryl", as used to describe an aryl group, refers to any functional group or substituent derived from an aromatic ring, be it phenyl ($C_6H_5$), naphthyl ($C_{10}H_8$), thienyl ($C_4H_4S$), indolyl, etc. (see IUPAC nomenclature). Each of the aforementioned aryl groups may be employed as the R-group to tune the glass transition temperature (Tg) of the styrene maleimide copolymer. The term "alkyl", as used herein describes an alkyl substituent in which an alkane is missing one hydrogen. An acyclic alkyl has the general formula $C_nH_{2n+1}$. A cycloalkyl is derived from a cycloalkane by removal of a hydrogen atom from a ring and has the general formula $C_nH_{2n-1}$. Typically an alkyl is a part of a larger molecule. In structural formula, the symbol R is used to designate a generic (unspecified) alkyl group. The smallest alkyl group is methyl, with the formula $CH_3$—. Alkyls form homologous series. The simplest series have the general formula $C_nH_{2n+1}$. Alkyls include methyl ($CH_3$), ethyl ($C_2H_5$), propyl ($C_3H_7$), butyl ($C_4H_9$), pentyl ($C_5H_{11}$), hexyl, heptyl, octyl, nonyl, decyl and dodecyl and combinations thereof. Alkyl groups that contain one ring have the formula $C_nH_{2n-1}$, e.g. cyclopropyl and cyclohexyl. Each of the aforementioned alkyl groups may be employed as the $R^1$, and $R^2$-groups to tune the glass transition temperature (Tg) of the styrene maleimide copolymer.

In some embodiments, vinyl ether-maleimide copolymer adhesive compositions can be provided that have a glass transition temperature (Tg) that ranges from 90° C. to 210° C. In some embodiments, the glass transition temperature (Tg) of the styrene maleimide copolymer adhesive may be 95, 100. 105, 110, 115, 120, 125, 130, 135, 140, 145, 150, 155, 160, 165, 170, 175, 180, 185, 190, 195, 200, and 205° C., as well as any range of temperatures including at least two of the above noted values. Adjustment of the glass transition temperature of the vinyl ether maleimide adhesives to the above temperature ranges allows for the adhesive to be applied to a device wafer and then engaged, i.e., bonded, to a handling wafer at a temperature that does not mechanically damage the adhesive layer, the device wafer, and the carrier wafer.

The vinyl ether maleimide copolymers can be made through simple free radical co-polymerization of vinyl ether and maleic anhydride monomers, followed by further chemical reaction with amine containing molecules on the polymer to form imides. Through this two stage polymer synthesis and modification, the vinyl ether-maleimide copolymer or terpolymer adhesives can be tailored to possess the desired optical, thermal and rheological properties. Further, in some embodiments, the materials can be synthesized through direct polymerization of vinyl ether and N-alkyl or N-aryl maleimide monomers if post-polymerization modification is desirable to avoid.

The vinyl ether-maleimide copolymer adhesives are fully soluble and castable in common/safe solvents (e.g., PGMEA). The ability of vinyl ether maleimide copolymer adhesives to be dissolved in a solvent, such as propylene glycol monomethyl ether acetate (e.g., PGMEA), provides that in wafer bonding techniques that employ laser debonding to detach the temporarily attached wafers that the adhesive may easily be removed from the wafers by dissolving it in these solvents.

The above adhesive compositions described above as maleimide copolymer compositions are hereafter referred to as "high performance polymer adhesive" and/or "high performance polymer adhesives". The high performance polymer adhesives disclosed herein may be used in any layer/substrate transfer and/or substrate bonding method used for forming semiconductor devices, memory devices, photovoltaic devices, microelectronic devices and nanoscale devices. For example, the high performance polymer adhesives may be used in process that employ mechanical spalling, such as the method described in U.S. Pat. No. 8,247,261 titled "THIN SUBSTRATE FABRICATION USING STRESS INDUCED SUBSTRATE SPALLING". The high performance polymer adhesives may also be used as a bonding adhesives in methods for forming III-V semiconductor containing semiconductor devices and photovoltaic devices that include a reusable germanium (Ge) containing substrate as a growth surface. In this example, once the III-V device is formed it is bonded to a supporting substrate, and the reusable germanium (Ge) containing substrate is removed from the III-V device to be used as the growth surface for forming another device. The high performance polymer adhesives may also be used in layer transfer processes that employ smart cut to separate a portion of a material layer for transfer to a supporting substrate. Smart cut may include implanting a dopant species, such as hydrogen, into a material layer to provide a weakened interface across when the material layer is to be cleaved. A portion of the cleaved material layer may be adhesively bonded to a supporting substrate using the high performance polymer adhesive. In other embodiments, the high performance polymer adhesives may be employed in a substrate, i.e., device wafer, thinning process. It is noted that the above examples of adhesive applications for the high performance polymer adhesives is provided for illustrative purposes only, and is not intended to limit the present disclosure. Further details of the methods and structures of the present disclosure that employ a high performance polymer adhesives as a bonding adhesive as part of a method sequence for forming semiconductor devices that includes wafer thinning and debonding of a handling wafer are now discussed with greater detail with reference to FIGS. 1-6.

FIG. 1 depicts one embodiment of a device wafer 5, e.g., semiconductor substrate, that may be employed in at least one embodiment of the present disclosure. In some embodiments, the device wafer 5 may be provided by a bulk semiconductor substrate. The bulk semiconductor substrate may have a single crystal, i.e., monocrystalline, crystal structure. In some embodiments, the device wafer 5 is composed of a silicon including material. In some embodiments, the silicon including material that provides the device wafer 5 may include, but is not limited to silicon, single crystal silicon, multicrystalline silicon, polycrystalline silicon, amorphous silicon, strained silicon, silicon doped with carbon (Si:C), silicon alloys or any combination thereof. In other embodiments, the device wafer 5 may be a semiconducting material that may include, but is not limited to, germanium (Ge), silicon germanium (SiGe), silicon germanium doped with carbon (SiGe:C), germanium alloys, GaAs, InAs, InP as well as other III/V and II/VI compound semiconductors. The thickness T1 of the device wafer 5 may range from 10 microns to a few millimeters.

Figure 2:
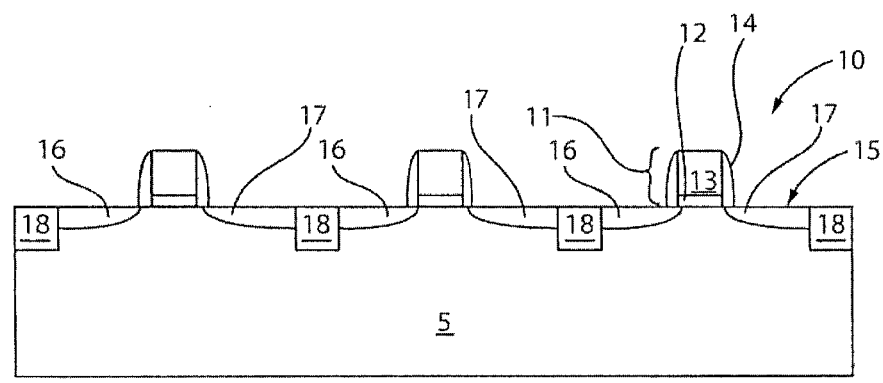
FIG. 2 is a side cross-sectional view of forming semiconductor devices on a front surface of the device wafer, in accordance with one embodiment of the present disclosure.

FIG. 2 depicts forming semiconductor devices 10 on a front surface 15 of the device wafer 5. As used herein, "semiconductor device" refers to an intrinsic semiconductor material that has been doped, that is, into which a doping agent has been introduced, giving it different electrical properties than the intrinsic semiconductor. In some embodiments, the semiconductor devices 10 are field effect transistors (FETs). A field effect transistor (FET) is a transistor in which output current, i.e., source-drain current, is controlled by the voltage applied to the gate. A field effect transistor typically has three terminals, i.e., gate, source and drain. The semiconductor devices 10 that may be formed using the methods of the present disclosure are applied to may be planar semiconductor devices, FinFETS, Trigate semiconductor devices, nanowire semiconductor devices or a combination thereof. The semiconductor devices 10 disclosed herein may also be provided by memory devices, e.g., flash memory or eDRAM memory.

In some embodiments, the semiconductor devices 10 may include a gate structure 11 that includes at least one gate dielectric 12, at least one gate conductor 13 and at least one gate sidewall spacer 14.

The at least one gate dielectric 12 may be a dielectric material, such as $SiO_2$, or alternatively high-k dielectrics, such as oxides of Ta, Zr, Al or combinations thereof. In another embodiment, the at least one gate dielectric 12 is comprised of an oxide, such as $SiO_2$, $ZrO_2$, $Ta_2O_5$ or $Al_2O_3$. In one embodiment, the at least one gate dielectric 12 may have a thickness ranging from 1 nm to 10 nm.

The at least one gate conductor layer 13 may include a metal gate electrode. The metal gate electrode may be any conductive metal including, but not limited to W, Ni, Ti, Mo, Ta, Cu, Pt, Ag, Au, Ru, Ir, Rh, and Re, and alloys that include at least one of the aforementioned conductive elemental metals. In other embodiments, the at least one gate conductor 13 may include a doped semiconductor material, such as a doped silicon containing material, e.g., doped polysilicon.

In some embodiments, a gate dielectric (not shown) may be present atop the at least one gate conductor 13. The at least one gate dielectric cap may be composed of an oxide or nitride material.

Each of the material layers for the gate dielectric cap, the at least one gate conductor layer 13, and the gate dielectric layer 12 may be formed using a deposition or growth process. For example, the gate dielectric layer 12 and the gate dielectric cap may be formed using a chemical vapor deposition (CVD) process, such as plasma enhanced CVD (PECVD). The gate conductor layer 13 may be formed using a physical vapor deposition (PVD) process, e.g., sputtering, when the gate conductor layer 13 is composed of a metal, or the gate conductor layer 13 may be formed using a chemical vapor deposition (CVD) process when the gate conductor layer 3 is composed of a doped semiconductor material, e.g., polysilicon.

Following formation of the gate stack, the stack of material layers are patterned and etched. Specifically, a pattern is produced by applying a photoresist to the surface of the gate stack to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The etch process for removing the exposed portions of the gate stack may be an anisotropic etch. As used herein, an "anisotropic etch process" denotes a material removal process in which the etch rate in the direction normal to the surface to be etched is greater than in the direction parallel to the surface to be etched.

The anisotropic etch process may be provided by reactive ion etch. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface.

A gate sidewall spacer 14 can be formed in direct contact with the sidewalls of the gate stack. The gate sidewall spacers 14 are typically narrow having a width ranging from 2.0 nm to 15.0 nm. The gate sidewall spacer 14 can be formed using deposition and etch processing steps. The gate sidewall spacer 14 may be composed of a dielectric, such as nitride, oxide, oxynitride, or a combination thereof.

FIG. 2 also depicts one embodiment of forming source and drain regions 16, 17 on the opposing sides of the gate structure 11. As used herein, the term "drain" means a doped region in a semiconductor substrate that is located at the end of the channel in field effect transistors (FET), in which carriers are flowing out of the transistor through the drain. As used herein, the term "source" is a doped region from which majority carriers are flowing into the channel. The source and drain regions 16, 17 may be formed by ion implanting an n-type or p-type dopant into the device wafer 5. As used herein, "p-type" refers to the addition of impurities to an intrinsic semiconductor that creates deficiencies of valence electrons. In a type IV semiconductor, such as silicon (Si), examples of n-type dopants, i.e., impurities, include but are not limited to: boron, aluminum, gallium and indium. As used herein, "n-type" refers to the addition of impurities that contributes free electrons to an intrinsic semiconductor. In a type IV semiconductor, such as silicon (Si), examples of n-type dopants, i.e., impurities, include but are not limited to antimony, arsenic and phosphorous. Typically, the conductivity type, i.e., n-type or p-type conductivity, for the source and drain regions 16, 17 is the conductivity type of the semiconductor device, e.g., n-type field effect transistor (nFET) or p-type field effect transistor (pFET).

In some embodiments, multiple semiconductor devices 10 are formed on the front side surface 15 of the device wafer 5, wherein the multiple semiconductor devices 10 may include a first set of first conductivity type semiconductor, e.g., n-type FET, and a second set a second conductivity type, e.g., p-type FET. Isolation regions 18, such as trench isolation regions may be formed separating semiconductor devices of different conductivity types, e.g., electrically isolated p-type FETS from n-type FETS. For example, lithography, etching and filling of the trench with a trench dielectric may be used in forming the trench isolation region. The trench isolation region may be composed of an oxide, such as silicon oxide.

Figure 3:
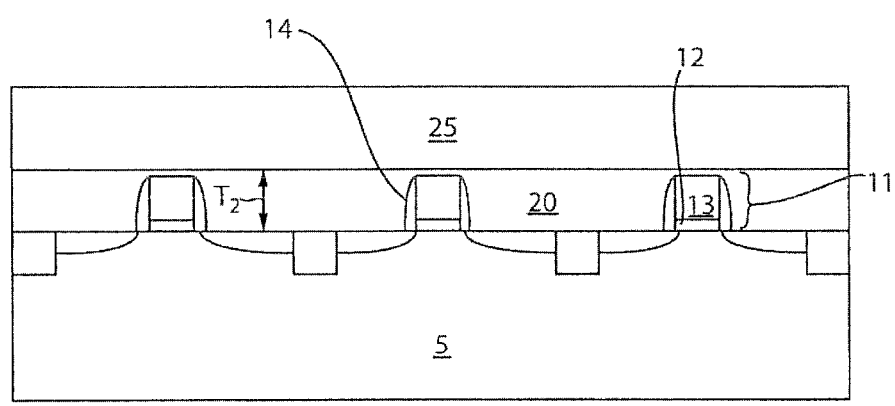
FIG. 3 is a side cross-sectional view of bonding a handling wafer to the front surface of the device wafer through an adhesive, in accordance with one embodiment of the present disclosure. The adhesive may be one of a styrene maleimide copolymer; vinyl ether maleimide copolymer and a combination thereof.

FIG. 3 depicts bonding a handling wafer 25 to the front side surface 15 of the device wafer 5 through an adhesive layer 20 containing the high performance polymer adhesive. The adhesive layer 20 may be composed of any of the high performance polymer adhesives that have been described above.

FIG. 3 depicts the device wafer 5 is bonded onto the handling wafer 25 creating a compound wafer. The bonding process should be compatible with the properties of the device wafer 5, such as surface topography, surface material, restrictions in process temperature, and combinations thereof. In some examples, the temporary adhesive, i.e., adhesive layer 20 containing high performance polymer adhesives, provides a planar surface to the topography of the device wafer 5, and establishes a void free bond interface for bonding to the handling wafer 25.

The adhesion layer 20 may be applied to the front side surface 15 of the device wafer 5 covering the semiconductor devices 10 using a deposition process, such as spin coating. Typical spin solvents that are suitable for depositing the adhesion layer 20 using spin coating may include Propylene Glycol Methyl Ether (PGME), Propylene glycol monomethyl ether acetate (PGMEA), ethyl lactate, N-Methyl-2-pyrrolidone (NMP) and combinations thereof. In some embodiments, the spin coating solution may further include cyclohexanone.

One example of a spin coating apparatus for depositing the adhesive layer 20 is a fully automated coater system ACS200 from SUSS MicroTec. In one example, a center dispense of the liquid material may be employed followed by a spread spin at 1000 rpm for 10 seconds. After the spread spin, the material was spun off at 1400 rpm for 60 seconds. It is noted that the above described coating process is only one example of a method of depositing the adhesion layer 20 on the front surface of the device wafer 5, and that other deposition methods may be suitable for applying the adhesion layer 20 of high performance polymer adhesives. For example, the adhesion layer 20 may be deposited using spraying, brushing, curtain coating and dip coating.

Following application of the adhesive layer 20 of high performance polymer adhesives to the front side surface 15 of the device wafer 5, a handling wafer 25 is contacted to the surface of the adhesive layer 20 that is opposite the surface of the adhesive layer 20 under temperature and pressure to provide that the handling wafer 25 is bonded to the device wafer 5 through the adhesive layer 20. In some embodiments, the thickness T2 of the adhesive layer 20 between the handling wafer 25 and the device wafer 5 may range from 2 microns to 10 microns. In other embodiments, the thickness T2 of the adhesive layer 20 may range from 2 microns to 5 microns.

The handling wafer 25 may be composed of a material and thickness to structurally support the device wafer 5 without warping or cracking during subsequent thinning steps, such as planarization and/or grinding. In one embodiment, the handling wafer 25 is composed of glass. In some embodiments, the material of the handling wafer is selected to have a coefficient of thermal expansion (CTE) that is similar to the CTE of the device wafer 5 to avoid any disadvantageous mechanical effects that can result from two materials engaged to one another having different thermal expansion coefficients, such as warping. In some embodiments, a glass handling wafer 25 may be advantageous to provide for transmission of the laser signal through the glass handling wafer 25 during subsequent laser debonding steps. In other embodiments, the handling wafer 25 may be composed of a metal material or a dielectric material. In some embodiments, the glass handling wafer 25 can be composed of a semiconductor material. For example, the above examples of semiconductor materials for the device wafer 25 are equally suitable for the semiconductor materials for the handling wafer 25.

To provide bonding, temperature and pressure was applied to the composite of the handling wafer 25, the adhesion layer 20 and the device wafer. In one embodiment, the bonding temperature may range between 150° C. to 250° C., and the pressure applied may range from 0.07 MPA to 0.22 MPa. In another embodiment, the bonding temperature may range from 150° C. to 200° C., and the pressure may range from 0.15 MPa to 0.22 MPa. The time period at which the bonding temperature and pressure is held may range from 10 minutes to 60 minutes. The bonding step may be performed in a nitrogen atmosphere. The above described bonding temperatures may be modified to account for the different glass transition (Tg) temperatures that have been described above for the high performance polymer adhesives.

Typically, bonding includes elevating the temperature of the adhesion layer 20 of the high performance polymer adhesives to effectuate curing of the polymer. In some embodiments, an adhesive layer 20 composed of the high performance polymer adhesives has a viscosity ranging from 100-10,000 Pa. seconds when at a temperature ranging from 160° C. to 210° C., and under a pressure of 1000 mbar per area of an 8 inch wafer size for at least one of the device wafer 5 and/or handing wafer 20. In another embodiment, the viscosity of the high performance polymer adhesives at temperatures ranging from 160° C. to 210° C. may range from 2500-10,000 Pa. second. In yet another embodiment, the viscosity of the high performance polymer adhesives at temperatures ranging from 160° C. to 210° C. may range from 5000-10,000 Pa. second. In one examples, the viscosity of the high performance polymer adhesives at temperatures ranging from 160° C. to 210° C. may be equal to 100, 200, 300, 400, 500, 600, 700, 800, 900, 1000, 1500, 2000, 2500, 3000, 3500, 4000, 4500, 5000, 5500, 6000, 6500, 7000, 7500, 8000, 8500, 9000, 9500, and 10000 Pa. second, and any range including at least two of the above noted values.

The adhesion layer 20 of high performance polymer adhesive following bonding to the handling wafer 25 and the device substrate 5 may have a shear strength of 40 MPa or greater.

Another advantage of the present methods is that the curing of the high performance polymer adhesives is at temperatures less than the curing temperatures that are required of prior adhesives, such as polyimides. For example, imidization of polyimides requires temperatures greater than 300° C., which results in damage to the device wafer, such a wafer warpage and/or cracking. Additionally, the high temperatures required of prior adhesives composed of polyimides may also result in unnecessary out diffusion of the dopants of the semiconductor devices that have been integrated into the device wafer 5. Bonding with the high performance polymer adhesives can be at temperatures below 300° C., which is at a temperature that does not damage, i.e., does not cause warping or cracking of the device wafer 5, and does not cause outdiffusion of the semiconductor device dopants. In one embodiment, the bonding temperature of the high performance polymer adhesives may range from 150° C. to 290° C. In another embodiment, the bonding temperature of the high performance polymer adhesive may range from 160° C. to 210° C. In other examples, the bonding temperature of the high performance polymer adhesives may be at 150, 160, 170, 180, 190, 200, 210, 220, 240, 250, 260, 270, 280 and 290° C., as well as any range including two of the aforementioned values.

In some embodiments, the high performance polymer adhesives that provide the adhesion layer 20 is not susceptible to degradation by exposure to the following solvents: acetone, NMP, 6N HCl, 15% $H_2O_2$, 30% $NH_4OH$, 10% KI in $H_2O$, EtOH, MeOH, Isopropyl Alcohol (IPA), cyclohexanone, ethyl lactate, PGMEA, PGME, 30% HCl, 70% $HNO_3$ and combinations thereof.

Figure 4:
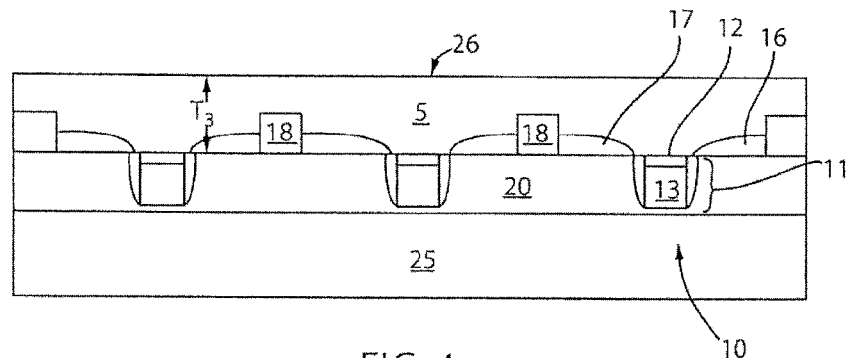
FIG. 4 is a side cross-sectional view depicting thinning the backside surface of the device wafer, in accordance with one embodiment of the present disclosure.

FIG. 4 depicts thinning the backside surface 26 of the device wafer 5. The device wafer 5 may be thinned by applying a planarization process and/or a grinding process to the backside surface 26 of the device wafer 5. In one example, the planarization and grinding process may be provided by chemical mechanical planarization (CMP). In an alternative embodiment, etch processes may be used to remove material from the back surface 26 of the device wafer 5. Following thinning of the backside surface 26 of the device wafer 5, the thinned device wafer 5 may have a thickness T3 ranging from 5 microns to 100 microns. In another embodiment, the thinned device wafer 5 may have a thickness T3 ranging from 20 microns to 50 microns. In one example, the thinned device wafer 5 may have a thickness T3 ranging from 5 microns to 10 microns. The handling wafer 25 supports the device wafer 5 during the mechanical thinning process to protect the device wafer 5 from mechanical failure, such as cracking.

Figure 5:
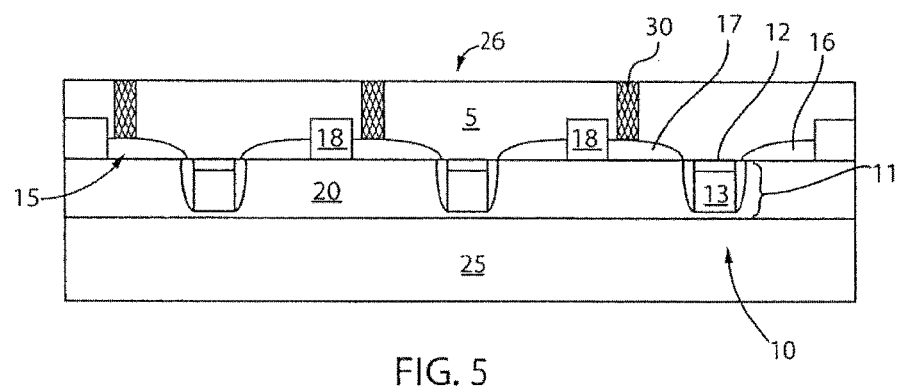
FIG. 5 is a side cross-sectional view depicting patterning the backside surface of the thinned device wafer, in accordance with one embodiment of the present disclosure.

FIG. 5 depicting one example of patterning the backside surface 26 of the thinned device wafer 5. The patterning step depicted in FIG. 5 may be employed to form interconnects to the semiconductor devices 10 that are integrated within the device wafer 5. For example, via interconnects 30, such as through silica vias (TSV), may be formed to the active regions of the device wafer 5. Through silica vias (TSV) may be employed to interconnect stacked devices wafers in forming a three dimensional (3D) microelectronic device. Vias can be formed to the active portions of the semiconductor devices, e.g., source and drain regions 16, 17, using photoresist deposition, lithographic patterning to form a photoresist etch mask, and etching, e.g., anisotropic etching. Following via formation, via interconnects 30 are formed by depositing a conductive metal into the via holes using deposition methods, such as CVD, sputtering or plating. The conductive metal may include, but is not limited to: tungsten, copper, aluminum, silver, gold and alloys thereof.

Figure 6:
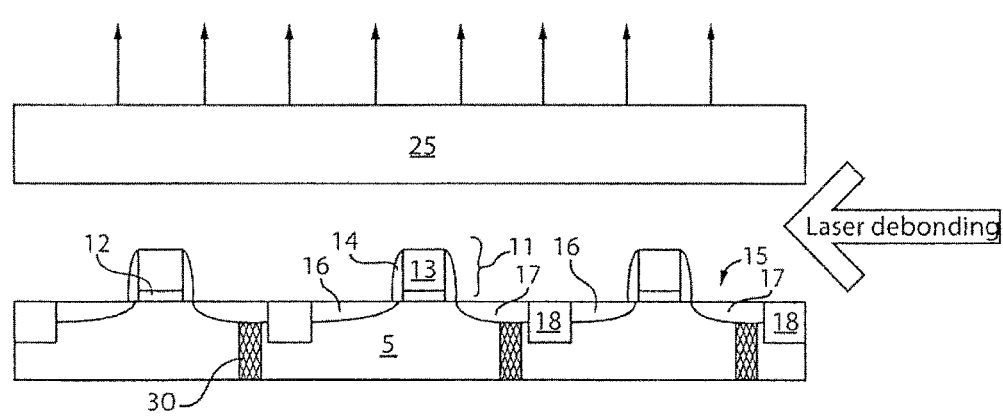
FIG. 6 is a side cross-sectional view depicting laser debonding to ablate the adhesive, and to remove the handling wafer from the device wafer, in accordance with one embodiment of the present disclosure.

FIG. 6 depicts one embodiment of debonding the handling wafer 25 from the device wafer 5. In one embodiment, debonding of the handling wafer 25 may include laser debonding to ablate the adhesion layer 20 containing the high performance polymer adhesives, and to remove the handling wafer 25 from the device wafer 5. Laser debonding may be provided by a 200 nm or 308 nm excimer laser. The UV laser may function using a cold process. For example, a 308 nm ultraviolet light emitted by the excimer laser is absorbed near the interface between the device wafer 5 and the glass handling wafer 25, penetrating only a few hundred nanometers. Thus, leaving the device wafer 5 unaffected. Furthermore, the ultraviolet light from the excimer laser debonds through primarily a photochemical means, by directly breaking chemical bonds in the adhesion layer 20 of high performance polymer adhesive. The excimer laser may be applied in line mode, or step and repeat mode. The non-thermal process breaks down the temporary adhesive, i.e., high performance polymer adhesive, at the adhesion layer 20 and glass handling wafer 25 interface. Following application of the excimer layer, the handling wafer 25 may be lifted and carried away from the device wafer 5.

In some embodiments, high performance polymer adhesive that remains on the device wafer 5 and/or carrier wafer 25 following removal of the adhesion layer 20 may be removed using a solvent, such as propylene glycol monomethyl ether acetate (e.g., PGMEA). In other embodiments, the solvent that is used for removing the high performance polymer adhesive may be selected from the group consisting of gamma-butyrolactone, ethyl lactate, other lactate isomers known under the tradename Gavesolv, NMP, Tetrahydrofuran (THF), PMAcetate, Methyl isobutyl ketone (MIBK), Methyl ethyl ketone (MEK), and combinations thereof.

Figure 7:
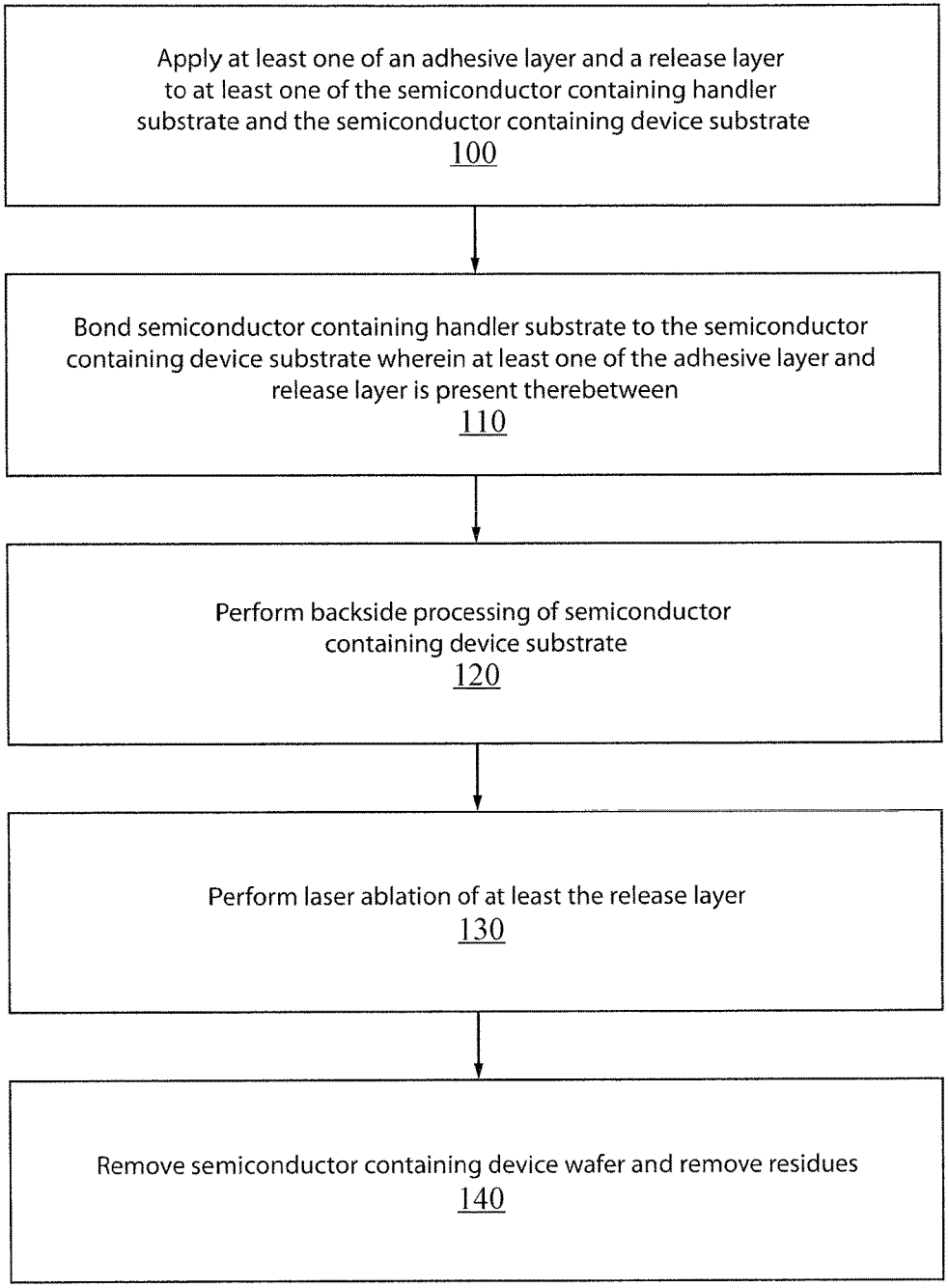
FIG. 7 is a flow chart illustrating another approach for performing semiconductor containing handler substrate bonding and de-bonding in accordance with other exemplary embodiments of the present disclosure.
Figure 8:
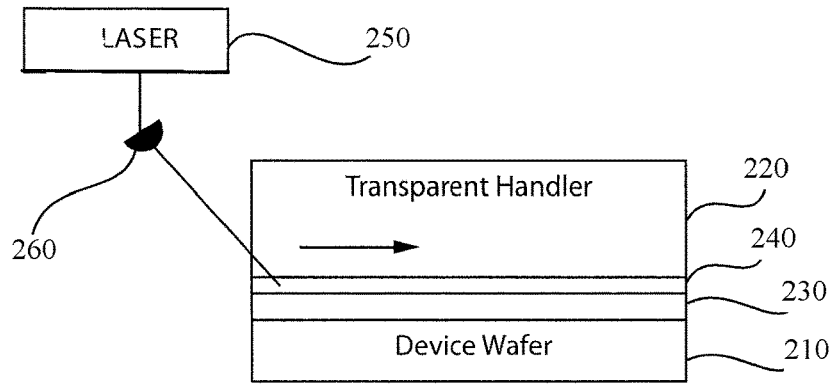
FIG. 8 is a schematic diagram illustrating bonding and de-bonding of a semiconductor containing device substrate to a silicon containing handler substrate, in accordance with exemplary embodiments of the present disclosure.

FIG. 7 is a flow chart illustrating an approach for performing handler substrate bonding and de-bonding in accordance with another exemplary embodiments of the present disclosure. Referring to FIGS. 7 and 8, the adhesive layer 230 may be applied to at least one of the semiconductor containing handler substrate 210 and the semiconductor containing device substrate 220 at step 100. The adhesive layer 230 is typically composed of a high performance polymer adhesive, as described above for the adhesive layer 20 that is depicted in FIGS. 3-5. Therefore, the description of the adhesive layer 20 that is depicted in FIGS. 3-5 can provide the description of some embodiments of the adhesive layer 230 that is depicted in FIG. 8. For example, the adhesive layer 230 may be any of the above described maleimide copolymers or terpolymers, which can include styrene maleimide copolymer, styrene/phenyl maleimide copolymer, vinyl ether-maleimide copolymer and combinations thereof.

In one embodiment, an adhesive layer 230 may be applied to one of the semiconductor containing handler substrate 220, and the semiconductor containing device substrate 210, and a release layer 240 may be applied to the other of the semiconductor containing handler substrate 210 and the semiconductor containing device substrate 220. In this example, both the adhesive layer 230 and the release layer 240 may be composed of the high performance maleimide copolymer or terpolymer adhesives described above, e.g., styrene maleimide copolymer, styrene/phenyl maleimide copolymer, vinyl ether-maleimide copolymer and combinations thereof.

Referring to FIGS. 7 and 8, in some embodiments, the device substrate 210 may be provided by a bulk semiconductor substrate. The device substrate 210 is similar to the device wafer 5 described above with reference to FIG. 2. For example, the device substrate 210 may be composed of crystalline silicon. The semiconductor containing device substrate 210 may include at least one semiconductor device, which may be planar semiconductor devices, Fin-FETS, Trigate semiconductor devices, nanowire semiconductor devices or a combination thereof. The semiconductor devices present in the semiconductor containing device substrate 210 may also include memory devices, e.g., flash memory or eDRAM memory.

The handler substrate 220 may also be composed of a semiconductor material. In one example, the handler substrate 220 may be a glass substrate. It is noted that the handler substrate 220 that is depicted in FIG. 8 is similar to the handling wafer 25 that is depicted in FIG. 3. Therefore, the description of the handling wafer 25 that is depicted in FIG. 3 is suitable for the handler substrate 220 that is depicted in FIG. 8.

As noted above, the adhesive layer 230 and the release layer 240 are applied to at least one of the semiconductor containing device substrate 210 and the semiconductor containing handler substrate 220. Although embodiments have been contemplated in which both the adhesive layer 230 and the release layer 240 are composed of high performance polymer adhesives, such as the above maleimide copolymers or terpolymers, which can include styrene maleimide copolymer, styrene/phenyl maleimide copolymer, vinyl ether-maleimide copolymer and combinations thereof, it is not necessary that each of the layers be composed of those materials. For example, in some other embodiments, the release layer 240 may be composed of a polyimide-based adhesive, such as HD3007, which can be spin applied and cured at 350° C. In yet other embodiments, the release layer 240 may be composed of a thermoplastic resin, such as phenoxy resin, e.g., Phenoxy Resin PKHC®, PKHH® or PKHJ® available from InChem Corp. In one example, one of the adhesive layer 230 and/or release layer 240 may be a phenoxy resin having the chemical name: polyoxy(2-hydroxy-1,3 propanediyl)oxy-1,4-phenylene(1-methylethylidene)-1, 4-phenylene.

Applying the adhesion layer 230 and/or the release layer 240 may be applied to the front side surface of the semiconductor containing device substrate 21 and the semiconductor containing handler substrate 22 using a deposition process, such as spin coating. Typical spin solvents that are suitable for depositing the adhesion layer 23 and/or the release layer 240 using spin coating may include Propylene Glycol Methyl Ether (PGME), Propylene glycol monomethyl ether acetate (PGMEA), ethyl lactate, N-Methyl-2-pyrrolidone (NMP) and combinations thereof. In some embodiments, the spin coating solution may further include cyclohexanone. The release layer 240 may also be optional.

Spin coating parameters may depend on the viscosity of the adhesion layer 230 and/or the release layer 240, but may fall in the range from approximately 500 rpm to approximately 3000 rpm. One example of a spin coating apparatus for depositing the adhesion layer 230 and/or the release layer 240 is a fully automated coater system ACS200 from SUSS MicroTec. In one example, a center dispense of the liquid material may be employed followed by a spread spin at 1000 rpm for 10 seconds. After the spread spin, the material was spun off at 1400 rpm for 60 seconds. It is noted that the above described coating process is only one example of a method of depositing the adhesion layer 230 and/or the release layer 240 on either of the semiconductor containing device substrate 210 or the semiconductor containing handler substrate 220, and that other deposition methods may be suitable for applying the adhesion layer 230 and/or the release layer 240. For example, the adhesion layer 230 and/or the release layer 240 may be deposited using spraying, brushing, curtain coating and dip coating.

In some embodiments, following application of the adhesion layer 230 and/or the release layer 240 by spin coating, and prior to the wafer bonding step, the spin coated layer of material may be cured. The soft-bake may fall in the range from approximately 80° C. to approximately 120° C. The temperature of the final cure may fall in the range from 200°

C. to 400° C. Higher cure temperatures may be more effective at ensuring thermal stability of the UV ablation layer during standard CMOS BEOL processing which may take place between 350° C. and 400° C.

Referring to FIG. 7, following application of the adhesive layer 230 and/or the release layer 240, the semiconductor containing device substrate 210 may be bonded to the semiconductor containing handler substrate 220 at step 110, such that the release layer 230 and the adhesive layer 240 are provided between the semiconductor containing device substrate 210 and the semiconductor containing handler substrate 220. The bonding may include a physical bringing together of the semiconductor containing device substrate 210 and the semiconductor containing handler substrate 220 under controlled heat and pressure in a vacuum environment, such as offered in any one of a number of commercial bonding tools.

In some embodiments, to provide bonding, temperature and pressure may applied to the composite of the semiconductor containing handler substrate 220, the adhesion layer 230, the optional release layer 240, and the semiconductor containing device substrate 210. In one embodiment, the bonding temperature may range between 150° C. to 250° C., and the pressure applied may range from 0.07 MPA to 0.22 MPa. In another embodiment, the bonding temperature may range from 175° C. to 200° C., and the pressure may range from 0.15 MPa to 0.22 MPa. The time period at which the bonding temperature and pressure is held may range from 10 minutes to 60 minutes. The bonding step may be performed in a nitrogen atmosphere. Each of the adhesive layer 240, and the release layer 230 (when present), following bonding to the semiconductor containing handler wafer 220, and the semiconductor containing device substrate 210 may have a shear strength of 40 MPa or greater. It is noted that further details regarding the bonding at step 210 of the process flow depicted in FIG. 7 is found in above with reference to the bonding steps depicted in FIG. 3.

Referring to FIG. 7, in some embodiments, after bonding to provide the composite of the semiconductor containing handler substrate 210, the adhesion layer 230, the optional release layer 240, and the semiconductor containing handler substrate 220, the desired processing may be performed to the backside surface of the semiconductor containing device substrate 210 at step 120. The backside surface of the semiconductor containing device substrate 210 is not engaged to one of the adhesive layer 230 or the release layer 240. The backside surface of the semiconductor containing device substrate 210 is typically opposite the surface of the semiconductor containing device substrate 210 that the semiconductor devices may be formed on, which may be referred to as the upper surface of the semiconductor containing device substrate 210. For example, backside processing may include such process steps as patterning, etching, thinning, etc. until the device wafer has achieved its desired state.

For example, in one embodiment, the semiconductor containing device substrate 210 may be thinned by applying a planarization process and/or a grinding process to the backside surface of the semiconductor containing device substrate 210. In one example, the planarization and grinding process may be provided by chemical mechanical planarization (CMP). In an alternative embodiment, etch processes may be used to remove material from the back surface of the semiconductor containing device substrate 210. Following thinning of the backside surface of the semiconductor containing device substrate 210, the thinned semiconductor containing device substrate 210 may have a thickness ranging from 5 microns to 100 microns. In another embodiment, the thinned semiconductor containing device substrate 210 may have a thickness ranging from 20 microns to 50 microns. In one example, the thinned semiconductor containing device substrate 210 may have a thickness ranging from 5 microns to 10 microns. The semiconductor containing handler substrate 220 supports the semiconductor containing device substrate 210 during the mechanical thinning process to protect the semiconductor containing device substrate 210 from mechanical failure, such as cracking.

In another example, the backside processing of the semiconductor containing device substrate 210 may include a patterning step to form interconnects to the semiconductor devices that are integrated within the semiconductor containing device substrate 210. Further details regarding forming the interconnects have been provided above with reference to FIG. 5.

After backside processing of the semiconductor containing device substrate 210, a laser ablation process may be performed to sever the semiconductor containing device substrate 210 from the semiconductor containing handler substrate 220 at step 130. During the laser ablation process, a laser emits a wavelength of light that is absorbed by at least one of the release layer 240 (when present), and the adhesive layer 230. To be transmitted through the semiconductor containing handler substrate 220, e.g., silicon (Si) handler substrate, and/or the semiconductor containing device substrate 210 to expose at least one of the adhesive layer 230 and a release layer 240 to the wavelengths of light being emitted from the laser at the bonded interface of the semiconductor containing device substrate 210 and the semiconductor containing handler substrate 220, the wavelength of light being emitted from the laser should be within the infra-red (IR) range or ultraviolet (UV) range. Upon exposure to the infra-red (IR) laser light, at least one of the adhesive layer 230 and the release layer 240 may burn, break down, or otherwise decompose. In yet other embodiments, the absorption of the infra-red (IR) or ultra-violet (UV) wavelengths by at least one of the adhesive layer 230 and the release layer 240 may cause the layer absorbing the infra-red (IR) wavelengths to melt. The burning, break down, melting or otherwise decomposition of at least one the adhesive layer 230 and the release layer 240 is referred to as "ablating" of the material layer with the infra-red (IR) laser.

Laser debonding to sever the semiconductor containing device substrate 210 from the semiconductor containing handler substrate 220 at step 130 may be performed using any one of a number of UV laser sources including excimer lasers operating at 308 nm (e.g. XeCl) or 351 nm (e.g. XeF) as well as diode-pumped (tripled) YAG laser operating at 355 nm or diode-pumped (quadrupled) YAG laser operating at 266 nm. UV ablation thresholds in the materials specified here may require 100-150 milliJoules per square cm (mJ/sq·cm) to effect release. Another laser debonding system may include a solid-state pumped tripled YAG laser at 355 nm by rapidly scanning a small spot beam across the wafer surface.

An exemplary 355 nm scanning laser debonding system may include a Q-switched tripled YAG laser with an output power of 5 to 10 Watts at 355 nm, with a repetition rate between 50 and 100 kHz, and pulse width of between 10 and 20 ns.

In one embodiments, infra-red (IR) light suitable for use with the present disclosure includes light with a wavelength ranging at a lower limit of the range from ≈700 nm to 800 nm, to a wavelength at an upper limit range, which may be 1 mm. Any laser emitting light within these wavelengths can be referred to as infra-red (IR) laser, and are suitable for ablating at least one of the adhesive layer 230, and the release layer 240, that is present at the bonded interface between the semiconductor containing device substrate 210, and the semiconductor containing handler substrate 220. For example, some laser diodes can emit wavelengths beyond 750 nm. In some embodiments, lasers suitable for laser ablating in accordance with present disclosure include lasers that emit light waves in the near-infrared spectral region (also called IR-A), which may range from ≈700 nm to 1400 nm. In other embodiments, the infra-red (IR) laser for ablating the release layer 240 and the adhesive layer 230 may emit short-wavelength infrared (SWIR, IR-B), which includes light waves extending from 1.4 to 3 µm. In yet other embodiments, the IR laser for ablating the release layer 240 and the adhesive layer 230 may emit mid-infrared (mid-wavelength infrared, MWIR, IR-C), which include wavelengths of light that may range from 3 µm to 8 µm. In yet even further embodiments, the IR laser for ablating the release layer 240 and the adhesive layer 230 may include long-wavelength infrared (LWIR, IR-C) ranges from 8 to 15 µm. In some embodiments, the IR laser for ablating the release layer 240, and the adhesive layer 230, may include long-wavelength infrared (LWIR, IR-C) followed by the far infrared (FIR), which ranges to 1 mm and is sometimes understood to start at 8 µm.

In some embodiments, the laser for ablating at least one of the release layer 240 and the adhesion layer 230 includes Nd:YAG (neodymium-doped yttrium aluminum garnet; Nd:$Y_3Al_5O_{12}$) lasers, helium neon (HeNe) lasers, krypton laser, carbon dioxide ($CO_2$) laser, carbon monoxide (CO) laser or a combination thereof.

Nd:YAG lasers are optically pumped using a flashtube or laser diodes. Nd:YAG lasers typically emit light with a wavelength of 1064 nm, in the infra-red (IR). However, there are also transitions near 940 nm, 1120 nm, 1320 nm, and 1440 nm. Nd:YAG lasers operate in both pulsed and continuous mode. Pulsed Nd:YAG lasers are typically operated in the so-called Q-switching mode. In this Q-switched mode, output powers of 250 megawatts, and pulse durations of 10 to 25 nanoseconds have been achieved. Nd:YAG absorbs mostly in the bands between 730-760 nm and 790-820 nm. The amount of the neodymium dopant in the material varies according to its use. For continuous wave output, the doping is significantly lower than for pulsed lasers. Some common host materials for neodymium are: YLF (yttrium lithium fluoride, 1047 and 1053 nm), $YVO_4$ (yttrium orthovanadate, 1064 nm), and glass. Nd:YAG lasers and variants are pumped either by flashtubes, continuous gas discharge lamps, or near-infrared laser diodes (DPSS lasers).

Helium-neon lasers may emit a wavelength of light ranging from approximately 1.15 µm to approximately 3.4 µm. A helium-neon laser or HeNe laser, is a type of gas laser whose gain medium consists of a mixture of helium and neon (10:1) inside of a small bore capillary tube, usually excited by a DC electrical discharge.

A krypton laser may emit a wavelength of light ranging on the order of 750 nm. A krypton laser is an ion laser, a type of gas laser using krypton ions as a gain medium, pumped by electric discharge.

Carbon dioxide ($CO_2$) lasers can emit light wavelengths at 10.6 µm, and some other wavelengths in that region, e.g., micrometer wavelengths being greater than 9.5 µm. Carbon dioxide ($CO_2$) lasers are gas lasers that are one of the highest-power continuous wave lasers, in which the ratio of output power to pump power can be as large as 20%. The pump source for carbon dioxide ($CO_2$) lasers may be transverse (high power) or longitudinal (low power) electrical discharge.

Carbon monoxide (CO) lasers can emit light wavelengths that in some embodiments can range from 2.6 µm to 4 µm, and in some other embodiments can range from 4.8 µm to 8.3 µm. The pump source for carbon monoxide (CO) lasers may be electrical discharge.

The at least one of the release layer 240 and the adhesive layer 230 according to exemplary embodiments of the present disclosure comprises a material that is broken down under the exposure of the infra-red (IR) or ultraviolet (UV) laser light. Where desired, the remainder of the adhesive layer 230 or release layer 240 that is not ablated by the infra-red (IR) or ultraviolet (UV) laser may be removed from either of the semiconductor containing device substrate 210 and the semiconductor containing handler substrate 220 using various processing techniques.

Referring to FIG. 7, after the laser ablation has resulted in the severing of the semiconductor containing device substrate 210 from the semiconductor containing handler substrate 220, the semiconductor containing device substrate 210 may be easily removed from the semiconductor containing handler substrate 220, e.g., by simply pulling the semiconductor containing handler substrate 220 away, and the semiconductor containing device substrate 210 may be cleaned to remove the adhesive layer 230, or remaining portion of the adhesive layer 230 at step 140.

In some embodiments, residues of adhesive layer 230 or release layer 240, e.g., residues from the high performance maleimide copolymer or terpolymer adhesives, that remains on one of the semiconductor containing handler substrate 220, and the semiconductor containing device substrate 210, following removal of the release layer 240 may be accomplished using a solvent selected from the group consisting of gamma-butyrolactone, ethyl lactate, other lactate isomers known under the tradename Gavesolv, NMP, Tetrahydrofuran (THF), PMAcetate, Methyl isobutyl ketone (MIBK), Methyl ethyl ketone (MEK), gamma-butyrolactone, ethyl lactate, other lactate isomers known under the tradename Gavesolv, NMP, Tetrahydrofuran (THF), PMAcetate, Methyl isobutyl ketone (MIBK), Methyl ethyl ketone (MEK), and combinations thereof.

Figure 9A:
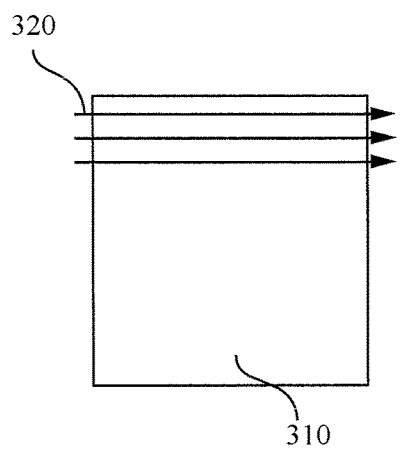
FIG. 9A is schematic diagrams illustrating a first pattern of applying the laser light to a top surface of the semiconductor containing handler substrate in accordance with exemplary embodiments of the present disclosure.
Figure 9B:
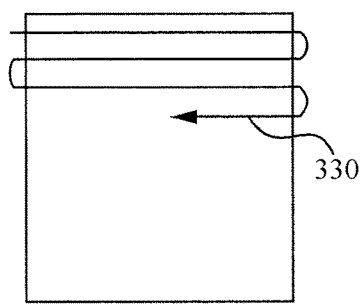
FIG. 9B is schematic diagrams illustrating a second pattern of applying the laser light to a top surface of the semiconductor containing handler substrate in accordance with exemplary embodiments of the present disclosure.

FIGS. 9A and 9B are schematic diagrams illustrating pattern of applying the laser light to a top surface 310 of the semiconductor containing handler substrate 220 in accordance with exemplary embodiments of the present disclosure. As seen in FIG. 9A, the laser light may be directed across the top surface 310 of the semiconductor containing handler substrate 220 as a spot beam drawn to lines 320 which move along an x-axis direction of the top surface 310 of the semiconductor containing handler substrate 220 with each successive line 320 being drawn lower in the y-axis direction. Alternatively, as seen in FIG. 9B, the laser light may be directed in a serpentine pattern 330.

Figure 10:
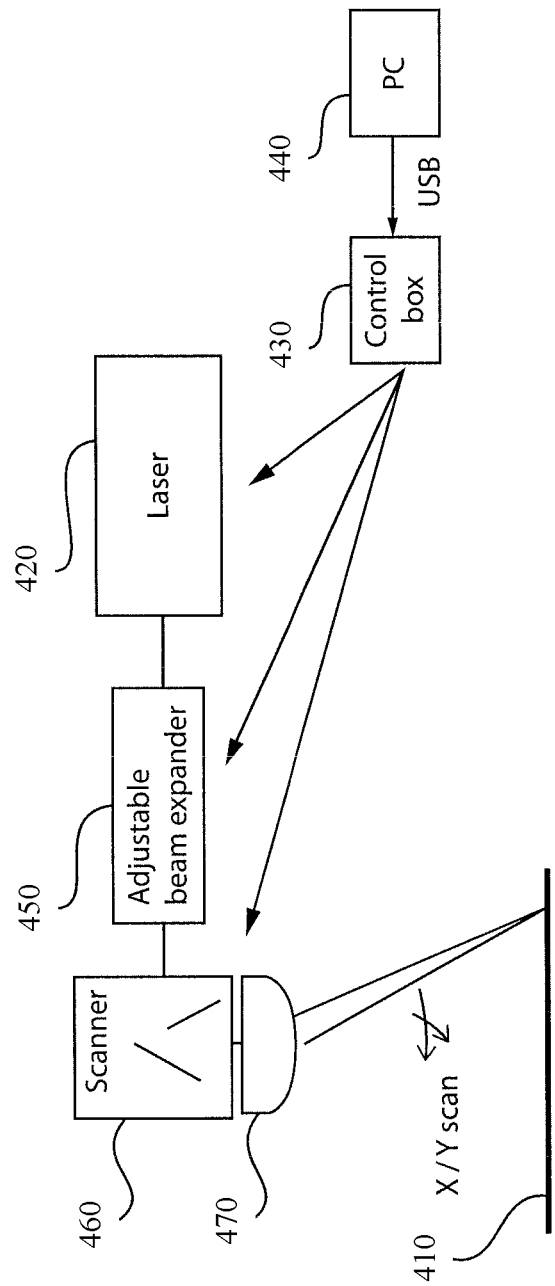
FIG. 10 is a schematic diagram illustrating a scanning laser de-bonding system in accordance with exemplary embodiments of the present disclosure.

FIG. 10 is a schematic diagram illustrating an apparatus for performing laser de-bonding in accordance with exemplary embodiments of the present disclosure. According to some exemplary embodiments of the present disclosure, such as is shown here in FIG. 10, the bonded semiconductor containing handler substrate and semiconductor containing device substrate 410 may remain stationary, e.g., on a stage. According to other exemplary embodiments, the stage may be movable. The laser 420, i.e., IR or UV laser, may provide a beam that may then be sent into a beam expander 450 to provide the desired beam size. The beam may then enter a scanner 460 where the beam can be directed along the x and y axes. One or more control units 430 may affect control of the laser 420, beam expander 450 and the scanner 460. Where the stage upon which the bonded handler and wafer 410 are held is movable, the controller 430 may control the movement of the stage as well. In such a case the scanner 460 may be omitted. A computer system 440 may be preprogrammed with the manner of control and these instructions may be executed though the one or more control units 430. A scan lens 470 may adjust the beam so as to strike the bonded handler and device wafer 410 with the desired spot characteristics.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Examples

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations.

Data Set 1

A description follows for 10 polymer compositions (identified as polymer 1, polymer 2, polymer 3, polymer 4, polymer 5, polymer 6, polymer 7, polymer 8, polymer 9 and polymer 10) and chemical structures that are suitable for use with the methods, structures and adhesive compositions described above. The experimental procedures for synthesizing the polymer compositions is also provide. A following section provides characterization of the six polymer compositions, which includes molecular weight Mw, polydispersity index (PDI), number average molecular weight Mn, thermal stability, and glass transition temperature (Tg).

Polymer Compositions and Chemical Structure

Polymer 1: Poly(Styrene-co-N-phenylmaleimide-co-maleic anhydride), x:y:z=2.00:0.76:0.24)

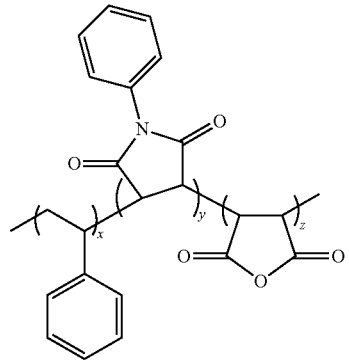

Polymer 2: Poly(Styrene-co-N-phenylmaleimide-co-maleic anhydride), x:y:z=1.30:0.84:0.16

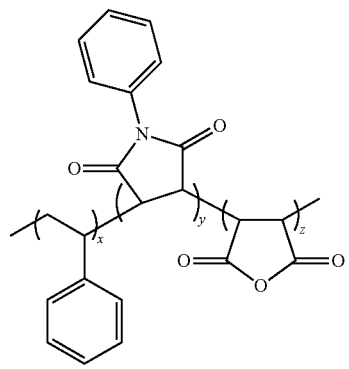

Polymer 3: Poly(Styrene-co-N-phenylmaleimide), x:y=0.48:0.52

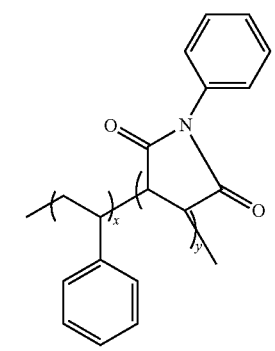

Polymer 4: Poly(Norbornenone-co-N-phenylmaleimide), x:y=1:2

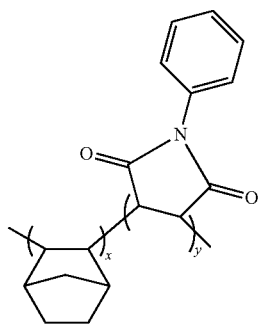

Polymer 5: Poly(Styrene-co-N-hexylmaleimide-co-maleic anhydride), x:y:z=2.0:0.80:0.20

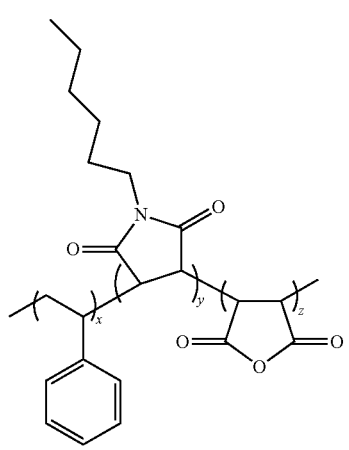

Polymer 6: Poly(Methyl vinyl ether-co-N-butylmaleimide-co-maleic anhydride), x:y:z=1.00:0.85:0.15

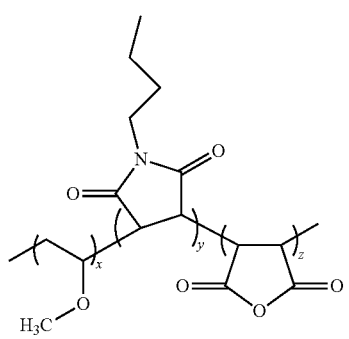

Polymer 7: Poly(butyl vinyl ether-co-N-phenylmaleimide), x:y=40:60

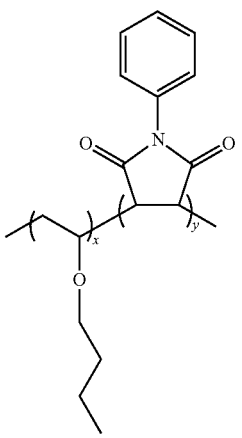

Polymer 8: Poly(butyl vinyl ether-co-N-methylmaleimide), x:y=40:60

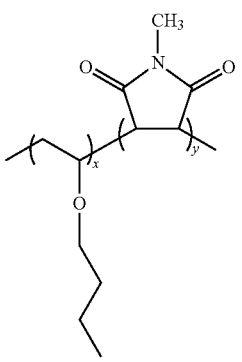

Polymer 9: Poly(butyl vinyl ether-co-N-ethylmaleimide) x:y=40:60

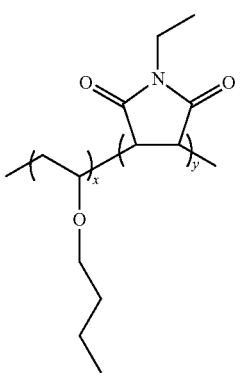

Polymer 10: Poly(dodecyl vinyl ether-co-phenylmaleimide) x:y=40:60

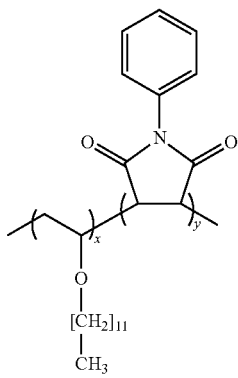

Polymer Synthesis of Polymers 1-10:

Polymer 1: Poly(styrene-co-maleic anhydride) 2:1, purchased from Aldrich Chemical Company, (20 grams, 0.065 moles of anhydride units) was dissolved in 200 ml N,N-dimethyl formamide (DMF). Aniline (10 grams, 0.108 mole) was added to this solution and heated to reflux for 5.5 hours. After allowing it to cool to room temperature, the solution was added drop wise into a solution of 2 liters of deionized water and 60 grams of concentrated HCl. The polymer was filtered through a frit funnel, washed with 250 ml deionized (DI) water and suction dried for 4 hours. This polymer was then dissolved in 250 ml acetone and precipitated again into a solution of 3 liters of water and 90 grams of concentrated HCl. This polymer was filtered, washed with 250 ml DI water and dried under vacuum at 90° C. for 24 hours. Yield was 23.64 grams.

Polymer 2: Poly(styrene-co-maleic anhydride) 1.3:1, purchased from Aldrich Chemical Company, (20 grams, 0.086 moles of anhydride units) was dissolved in 200 ml N,N-dimethyl formamide (DMF). Aniline (12 grams, 0.128 mole) was added to this solution and heated to reflux for 5 hours. After allowing it to cool to room temperature, the solution was added drop wise into a solution of 2 liters of deionized water and 60 grams of concentrated HCl. The polymer was filtered through a frit funnel, washed with 250 ml DI water and suction dried for 4 hours. This polymer was then dissolved in 135 ml acetone and precipitated again into a solution of 1.3 liters of water and 30 grams of concentrated HCl. This polymer was filtered, washed with 250 ml DI water and dried under vacuum at 90° C. for 24 hours. Yield was 25.04 grams.

Polymer 3: Styrene (7.81 g, 0.075 mole) and N-phenylmaleimide (13.00 g, 0.075 mole) and 187.29 grams of DMF were placed in a round bottom flask equipped with a condenser and a nitrogen inlet. 2,2'-Azobisisobutyronitrile (AIBN), (0.99 g, 0.006 mole) was added to this solution and stirred until dissolved. Then, the solution was degassed using four vacuum/nitrogen purges. The contents were then heated at 90° C. for 18 hours. Afterwards, the solution was added drop wise into a solution of 2 liters of DI water and 60 grams of concentrated HCl. The precipitated polymer was filtered (frit), washed twice with water (250 ml) and dried under vacuum at 90° C. The polymer was then dissolved in 250 ml of tetrahydrofuran (THF), and precipitated again into a solution of 2 liters of water and 60 grams of concentrated HCl. The polymer was filtered, washed with 250 ml DI water and dried under vacuum at 90° C. for 24 hours. Yield was 20.65 grams.

Polymer 4: Norbornene (9.42 g, 0.10 mole) and N-phenylmaleimide (17.32 g, 0.010 mole) and 240 grams of DMF were placed in a round bottom flask equipped with a condenser and a nitrogen inlet. 2,2'-Azobisisobutyronitrile (AIBN), (1.32 g, 0.008 mole) was added to this solution and stirred until dissolved. Then, the solution was degassed using four vacuum/nitrogen purges. The contents were then heated at 90° C. for 18 hours. Afterwards, the solution was added drop wise into a solution of 2.8 liters of DI water and 40 grams of concentrated HCl. The precipitated polymer was filtered (frit), washed twice with water (250 ml) and dried under vacuum at 90° C. This polymer was then dissolved in 150 ml of tetrahydrofuran (THF) and precipitated again into 3 liters of hexanes. This polymer was filtered, washed with 150 ml hexanes and dried under vacuum at 90° C. for 18 hours. Yield was 15.13 grams.

Polymer 5: Poly(styrene-co-maleic anhydride) 2:1, purchased from Aldrich Chemical Company, (20 grams, 0.065 moles of anhydride units) was dissolved in 200 ml N,N-dimethyl formamide (DMF). Hexylamine (10.2 grams, 0.10 mole) was added to this solution and heated to reflux for 18 hours. After allowing it to cool to room temperature, the solution was added drop wise into a solution of 3 liters of deionized water and 80 grams of concentrated HCl. The polymer was filtered through a frit funnel, washed twice with 250 ml DI water and suction dried for 4 hours. This polymer was then dried under vacuum at 90° C. for 24 hours. Yield was 24.13 grams.

Polymer 6: Poly(methyl vinyl ether-alt-maleic anhydride), purchased from Aldrich Chemical Company, (46.8 grams, 0.30 moles of anhydride units) was dissolved in 400 ml N,N-dimethyl formamide (DMF). Butylamine (22.2 grams, 0.303 mole) was added to this solution and heated to reflux for 7 hours. After allowing it to cool to room temperature, the solution was added drop wise into a solution of 3.6 liters of deionized water and 45 grams of concentrated HCl. The polymer was filtered through a frit funnel, washed twice with 300 ml DI water and suction dried for 18 hours. This polymer was then dried under vacuum at 90° C. for 72 hours. Yield was 47.32 grams.

Polymer 7: N-butyl vinyl ether (5.71 g, 0.057 mole) and N-phenylmaleimide (9.86 g, 0.075 mole) and 140.13 grams of DMF were placed in a round bottom flask equipped with a condenser and a nitrogen inlet. 2,2'-Azobisisobutyronitrile (AIBN), (0.75 g, 0.0045 mole) was added to this solution and stirred until dissolved. Then, the solution was degassed using four vacuum/nitrogen purges. The contents were then heated at 80° C. for 18 hours. Afterwards, the solution was added drop wise into a solution of 1.5 liters of DI water and 35 ml of concentrated HCl. The precipitated polymer was filtered (frit), washed twice with water (250 ml) and dried under vacuum at 95° C. for 30 hours. Yield: 13.24 grams.

Polymer 8: N-butyl vinyl ether (5.6 g, 0.0557 mole) and N-methylmaleimide (6.19 g, 0.0557 mole) and 106.11 grams of DMF were placed in a round bottom flask equipped with a condenser and a nitrogen inlet. 2,2'-Azobisisobutyronitrile (AIBN), (0.73 g, 0.0044 mole) was added to this solution and stirred until dissolved. Then, the solution was degassed using four vacuum/nitrogen purges. The contents were then heated at 90° C. for 18 hours. Afterwards, the solution was added drop wise into a solution of 1.5 liters of DI water and 35 ml of concentrated HCl. The precipitated polymer was filtered (frit), washed twice with water (250 ml) and dried under vacuum at 95° C. for 20 hours. Yield: 8.16 grams.

Polymer 9: N-butyl vinyl ether (5.68 g, 0.0567 mole) and N-ethylmaleimide (7.10 g, 0.0567 mole) and 115.02 grams of DMF were placed in a round bottom flask equipped with a condenser and a nitrogen inlet. 2,2'-Azobisisobutyronitrile (AIBN), (0.56 g, 0.0034 mole) was added to this solution and stirred until dissolved. Then, the solution was degassed using four vacuum/nitrogen purges. The contents were then heated at 85° C. for 18 hours. Afterwards, the solution was added drop wise into a solution of 1.2 liters of DI water and 20 ml of concentrated HCl. The precipitated polymer was filtered (frit), washed twice with water (300 ml) and dried under vacuum at 95° C. for 20 hours. Yield: 9.65 grams.

Polymer 10: N-dodecyl vinyl ether (6.68 g, 0.0315 mole) and N-phenylmaleimide (5.45 g, 0.0315 mole) and 48.52 grams of DMF were placed in a round bottom flask equipped with a condenser and a nitrogen inlet. 2,2'-Azobisisobutyronitrile (AIBN), (0.052 g, 0.00031 mole) was added to this solution and stirred until dissolved. Then, the solution was degassed using four vacuum/nitrogen purges. The contents were then heated at 80° C. for 18 hours. Afterwards, the solution was added drop wise into a solution of 800 ml of DI water and 15 ml of concentrated HCl. The precipitated polymer was filtered (frit), washed twice with water (300 ml) and dried under vacuum at 80° C. for 72 hours. Yield: 10.67 grams. This polymer according to NMR data had some monomer (dodecyl vinyl ether) left. 7 grams of this polymer was dissolved in 35 ml acetone. This solution was slowly added into 700 ml of methanol. The precipitated polymer was filtered (frit) and dried under vacuum at 90° C. for 18 hours. Yield: 5.29 grams.

Characterization:

$^1$H and $^{13}$C NMR spectra for polymers 1-6 were obtained for poluat room temperature on an Avance 400 spectrometer. Quantitative $^{13}$C NMR was on polymers 1-6 run at room temperature in acetone-$d_6$ in an inverse-gated $^1$H-decoupled mode using Cr(acac)$_3$ as a relaxation agent on an Avance 400 spectrometer. Thermo-gravimetric analysis (TGA) was performed on polymers 1-6 at a heating rate of 10° C./min in N$_2$ on a TA Instrument Hi-Res TGA 2950 Thermogravimetric Analyzer. Differential scanning calorimetry (DSC) was performed on each of polymers 1-6 at a heating rate of 4° C./min on a TA Instruments DSC 2920 modulated differential scanning calorimeter. Molecular weights were measured in tetrahydrofuran (THF) or dimethylformamide (DMF) on a Waters Model 150 chromatograph relative to polystyrene standards. The results of the characterization of the polymers is included in the following Table 1:

TABLE 1

CHARACTERIZATION OF POLYMER COMPOSITIONS 1-10

| Polymer | $M_w$ | $M_n$ | PDI | Thermal Stability ° C. Wt. loss < 5% (TGA) | $T_g$ ° C. (DSC) |
|---|---|---|---|---|---|
| 1 | 7,353 | 4,238 | 1.73 | 300 | 160 |
| 2 | 6.231 | 3,545 | 1.76 | 300 | 180 |
| 3 | 55,187 | 22,565 | 2.44 | 300 | 209 |
| 4 | 1,965 | 1,312 | 1.50 | 300 | 182 |
| 5 | 8,424 | 4,722 | 1.78 | 300 | 92 |
| 6 | 5,169 | 3,694 | 1.40 | 300 | 90 |
| 7 | 13,824 | 6,617 | 2.08 | 300 | 160 |
| 8 | 13,569 | 6,734 | 2.01 | 300 | 142 |
| 9 | 15,744 | 7,694 | 2.04 | 300 | 119 |
| 10 | 33,614 | 19,048 | 1.76 | 300 | 107 |

Data Set 2

Optimization of Polymer 10 (Poly(Dodecyl Vinyl Ether-Co-Phenylmaleimide)

Poly(dodecyl vinyl ether-co-phenylmaleimide) was further optimized by changing the solvent, percentage of the solids in the solution, amount of initiator (AIBN), and the temperature of the polymerization reaction. The conditions and the polymer properties are presented in Table 2, which describes Polymers 11-15 that are each based upon Poly(dodecyl vinyl ether-co-phenylmaleimide).

TABLE 2

POLY(DODECYL VINYL ETHER-CO-PHENYLMALEIMIDE) REACTION CONDITIONS AND PROPERTIES:

| Poly | Condition | AIBN | Temp | Comp By NMR (x:y) | Mn | Mw | Tg | Yield |
|---|---|---|---|---|---|---|---|---|
| 11 | 25 wt % in DMF | 0.5 mol % | 70° C. | 40:60 | 23,881 | 42,360 | 114 C. | 70% |
| 12 | 35 wt % in DMF | 0.5 mol % | 70° C. | 40:60 | 33,489 | 58,572 | 113 C. | 70% |
| 13 | 35 wt % in DMF | 0.25 mol % | 70° C. | 40:60 | 29,238 | 51,576 | 111 C. | 70% |
| 14 | 33 wt % in CHCL3 | No Initiator | 60° C. | 45:65 | 167,740 | 339,741 | 100 C. | 25% |
| 15 | 33% in CHCL3 | 0.5 mol % | 60° C. | 45:55 | 76,244 | 188,510 | 101 C. | 84% |

Adhesive Materials Pre-Screen Protocol for Data Set 2

Test polymer for were dissolved in a spin solvent (e.g., PGMEA or Cyclohexanone) to a solution of 30-40% solids. Solution was filtered with 1 μm glass filter. Polymer solution was spun cast on a 1 inch silicon wafer (or larger) at 1500 rpm, with a ramp speed of 100 rpm/s for a total of 60 seconds. The polymer coated wafer was pre-baked at 110° C. for 2 minutes and thereafter directly transferred to a 250° C. or 300 C hotplate (no chilling) and baked for 5 minutes. The baked wafer was removed from the hotplate and suspended in air for slow cooling or cooled on a chill plate. Observations of coating quality after spin, pre-bake, main bake and chill was noted. Thickness was measured by a profilometer. Solubility of film was tested in cold and hot spinning solvent (e.g., PGMEA), cold and hot EKC865™ and/or cold or hot NMP in order as listed until film was dissolved. From the above noted pre-screen protocol, polymer compositions 11 and 12 were selected for further evaluation.

Evaluation of Polymers 11 and 12

A solution was made in propylene glycol monomethyl ether acetate (PGMEA) and the solution was filtered through a 1 micrometer glass filter. This solution was spun cast on a 4" silicon wafer at 1500 rpm (ramp: 50 rpm/s) and prebaked at 110° C. for 2 minutes. Then the film was baked at 250° C. for 5 minutes and the dissolution properties were determined. The results are presented in Table 3.

TABLE 3

DISSOLUTION AND THICKNESS OF POLYMERS 11 AND 12

| Formulation | Thickness after 250 C. bake | Dissolution after 250 C. bake |
|---|---|---|
| 35 wt % solution of polymer 11 in PGMEA | 7.4 micrometer | Soluble within 10 minutes in PGMEA and EKC865 at 25° C. |
| 30 wt % solution of polymer 12 in PGMEA | 5.0 micrometer | Soluble within 10 minutes in PGMEA and EKC865 at 25° C. |

A bonding experiment was then conducted with formulations of polymer compositions 11 and 12. A first adhesive (hereafter referred to as adhesive 1) included polymer 11 in propylene glycol monomethyl ether acetate (PGMEA), wherein polymer 11 composition was present in an amount equal to 35 wt. % solid. A second adhesive (hereafter referred to as adhesive 2) included polymer 12 in propylene glycol monomethyl ether acetate (PGMEA), wherein polymer was present in an amount equal to 30 wt. % solid. Each adhesive, i.e., adhesive 1 and adhesive 2, was applied to substrates, i.e., wafers, for bonding. The deposition process for adhesive 1 included a spin on deposition process at 800 rpm, followed by a bake at 110° C. for approximately 10 minutes, which resulted in a deposited thickness of approximately 12 um. The deposition process for adhesive 2 included a spin on deposition process at 1500 rpm, followed by a bake at 110° C. for approximately 10 minutes, which resulted in a deposited thickness of approximately 5.5 um. Both wafers including the deposited adhesive 1 and adhesive 2 were then baked at 180° C. for 10 minutes. Both wafers, i.e., wafer including adhesive 1, and wafer including adhesive 2, exhibited a smooth and uniform coating.

The wafers including the applied adhesives, i.e., adhesive 1 or adhesive 2, where then bonded to a bonding wafer. The bonding conditions included that both wafers, i.e., wafers including adhesive 1 and wafers including adhesive 2, where bonding to bonding wafers at a temperature of 170° C. for a time period of 1 minute using a 1500 mbr tool pressure. Observation of the bonded structures illustrated that both adhesive compositions, i.e., adhesive 1 and adhesive 2, provided bonds without voids.

Debonding was not detected using razor blade testing. A razor blade could not damage, e.g., debond, the edge of the bonded interface. For example, a razor blade that is applied to the edge of the bonded interface could not debond the adhesive, i.e. adhesive 1 or adhesive 2, from the wafer to which the adhesive has been bonded.

Data Set 3

Wafer bond/debond adhesives were also characterized by rheological measurements to determine the complex viscosity vs temperature correlation. This correlation was used to determine the bonding temperature. In our case, the temperature at which the complex viscosity was around 750 Pa·s was selected as the bonding temperature.

Figure 11:
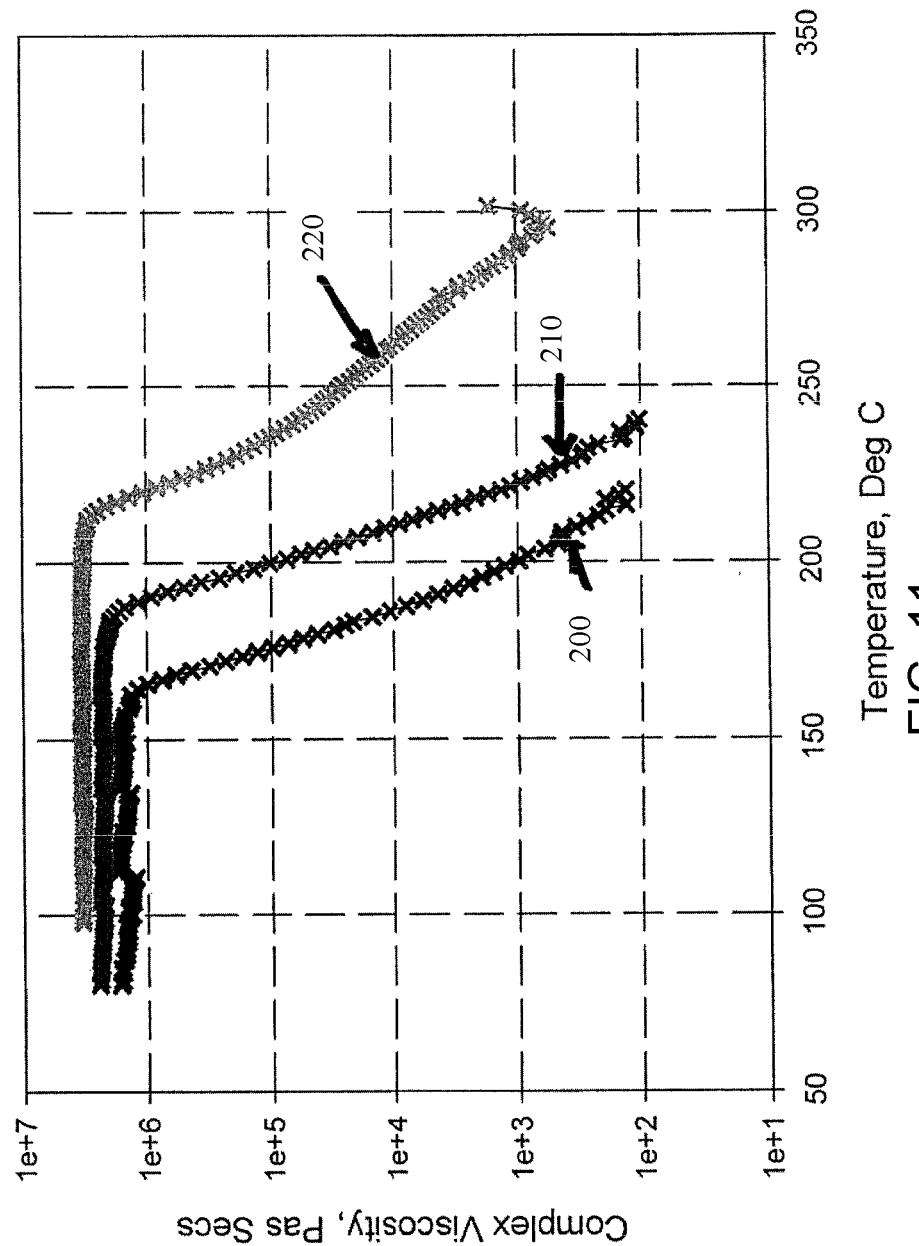
FIG. 11 is a plot of complex viscosity (Pa sec) as a function of temperature for polymeric adhesives composed of styrene maleimide copolymers, in accordance with one embodiment of the present disclosure.

FIG. 11. is a plot of illustrating complex viscosity (Pa sec) as a function of temperature for polymeric adhesives composed of styrene maleimide copolymers. Plot line 200 is viscosity data measured from an adhesive composed of styrene maleimide copolymers designated as Polymer 1, Plot line 210 is viscosity data measured from an adhesive composed of styrene maleimide copolymers designated as Polymer 2. Plot line 220 is viscosity data measured from an adhesive composed of styrene maleimide copolymer designated as Polymer 3.

Figure 12:
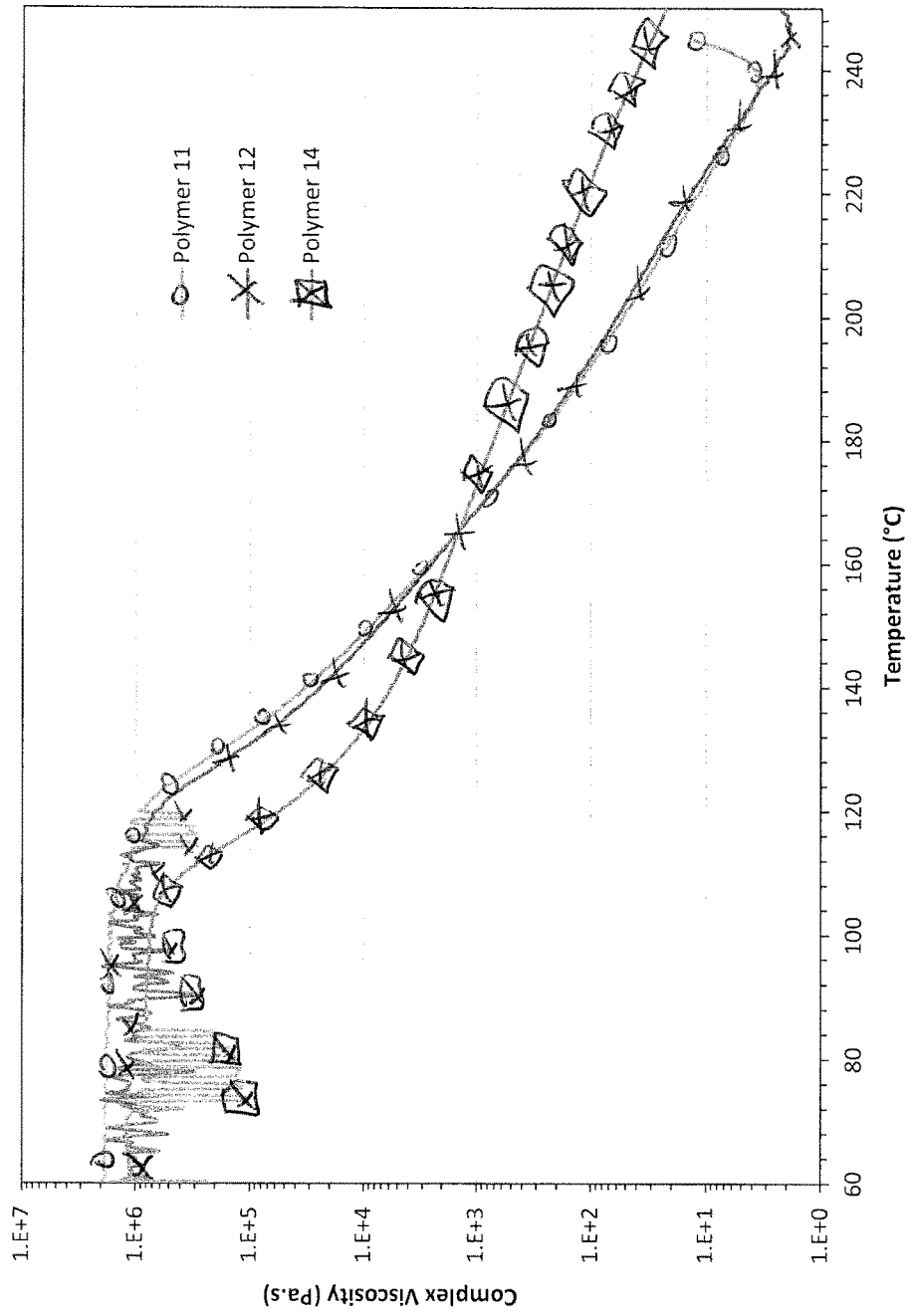
FIG. 12 is a plot of illustrating complex viscosity (Pa sec) as a function of temperature for polymeric adhesives composed of vinyl ether-maleimide copolymers.

FIG. 12 is a plot of complex viscosity (Pa sec) as a function of temperature for polymeric adhesives composed of vinyl ether-maleimide copolymers, Polymer 11, Polymer 12, and Polymer 14 respectively. The temperature ranges from 60° C. to 250° C.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A wafer bonding adhesive comprising a maleimide copolymer that is thermally stable at temperatures greater than 300° C., the maleimide copolymer including at least one functional group selected from the group consisting of: aryl group, alkyl group and combinations thereof resulting in the maleimide copolymer having a glass transition temperature within a range of 50° C. to 225° C.

2. The wafer bonding adhesive of claim 1, wherein the maleimide copolymer is an N-substituted maleimide copolymer.

3. The wafer bonding adhesive of claim 2, wherein the N-substituted maleimide copolymer is a vinyl ether/maleimide copolymer.

4. The wafer bonding adhesive of claim 2, wherein the N-substituted maleimide copolymer comprises poly(dodecyl vinyl ether-co-phenylmaleimide).

5. The wafer bonding adhesive of claim 2, wherein the N-substituted maleimide copolymer comprises poly(styrene-co-N-phenylmaleimide).

6. The wafer bonding adhesive of claim 2, wherein the N-substituted maleimide copolymer comprises poly(styrene-co-N-phenylmaleimide-co-maleic anhydride).

7. The wafer bonding adhesive of claim 2, wherein the N-substituted maleimide copolymer comprises poly(norbornene-co-N-phenylmaleimide).

8. The wafer bonding adhesive of claim 2, wherein the N-substituted maleimide copolymer comprises poly(styrene-co-N-hexylmaleimide-co-maleic anhydride).

9. The wafer bonding adhesive of claim 2, wherein the N-substituted maleimide copolymer comprises poly(methyl vinyl ether-co-N-butylmaleimide-co-maleic anhydride).

10. The wafer bonding adhesive of claim 2, wherein the N-substituted maleimide copolymer comprises poly(butyl vinyl ether-co-N-phenylmaleimide).

11. The wafer bonding adhesive of claim 2, wherein the N-substituted maleimide copolymer comprises poly(butyl vinyl ether-co-N-methylmaleimide).

12. The wafer bonding adhesive of claim 2, wherein the N-substituted maleimide copolymer comprises poly(butyl vinyl ether-co-N-ethylmaleimide).

13. The wafer bonding adhesive of claim 1, wherein the maleimide copolymer is selected from the group consisting of: styrene-N-alkylmaleimide copolymer, styrene-N-arylmaleimide copolymer, vinyl ether-N-alkylmaleimide copolymer, vinyl ether-N-arylmaleimide copolymer, and combinations thereof.

14. The wafer bonding adhesive of claim 13, wherein the vinyl ether monomer is selected from alkyl vinyl ethers and aryl vinyl ethers.

15. The wafer bonding adhesive of claim 1, wherein the aryl group is selected from the group consisting of: phenyl ($C_6H_5$), naphthyl ($C_{10}H_8$), thienyl ($C_4H_4S$), indolyl and combinations thereof.

16. The wafer bonding adhesive of claim 1, wherein the alkyl group is selected from the group consisting of: methyl ($CH_3$), ethyl ($C_2H_5$), propyl ($C_3H_7$), butyl ($C_4H_9$), pentyl ($C_5H_{11}$), hexyl ($C_6H_{13}$), octyl ($C_8H_{17}$), decyl ($C_{10}H_{21}$), dodecyl ($C_{12}H_{25}$), cyclopropyl, cyclohexyl and combinations thereof.

* * * * *